United States Patent
Waheed et al.

(10) Patent No.: US 8,150,336 B2
(45) Date of Patent: Apr. 3, 2012

(54) APPARATUS AND METHOD FOR ADAPTIVE POLAR TRANSMITTER LINEARIZATION AND WIRELESS TRANSMITTER EMPLOYING THE SAME

(75) Inventors: Khurram Waheed, Plano, TX (US); Seydou N. Ba, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 673 days.

(21) Appl. No.: 12/193,186

(22) Filed: Aug. 18, 2008

(65) Prior Publication Data
US 2009/0054000 A1 Feb. 26, 2009

Related U.S. Application Data

(60) Provisional application No. 60/957,119, filed on Aug. 21, 2007.

(51) Int. Cl.
*H04B 1/04* (2006.01)
*H04K 3/00* (2006.01)
(52) U.S. Cl. .................................. 455/114.3; 375/296
(58) Field of Classification Search ............... 455/114.3, 455/126; 375/295, 296
See application file for complete search history.

(56) References Cited

U.S. PATENT DOCUMENTS

| 7,349,490 B2 * | 3/2008 | Hunton ........................ 375/296 |
| 2006/0046665 A1 * | 3/2006 | Yang et al. ................. 455/114.3 |
| 2007/0190952 A1 * | 8/2007 | Waheed et al. ............ 455/114.3 |

OTHER PUBLICATIONS

U.S. Appl. No. 12/193,104; filed Aug. 18, 2008; Apparatus and Method for Adaptive Cartesian Transmitter Linearization and Wireless Transmitter Employing the Same; Khurram Waheed, et al.

* cited by examiner

*Primary Examiner* — Lee Nguyen
(74) *Attorney, Agent, or Firm* — Wade J. Brady, III; Frederick J. Telecky, Jr.

(57) ABSTRACT

A polar transmitter and a method of linearizing a polar transmitter. In one embodiment, the transmitter includes: (1) a transmit chain having a predistorter configured to employ first amplitude and phase compensation lookup tables to carry out predistortion in the transmit chain, (2) a receiver coupled to the transmit chain and (3) predistortion compensation circuitry associated with the receiver and configured to update second amplitude and phase compensation lookup tables associated therewith based on at least one signal from the transmit chain, the values in the updated second amplitude and phase compensation lookup tables thereby available for subsequent predistortion.

4 Claims, 17 Drawing Sheets

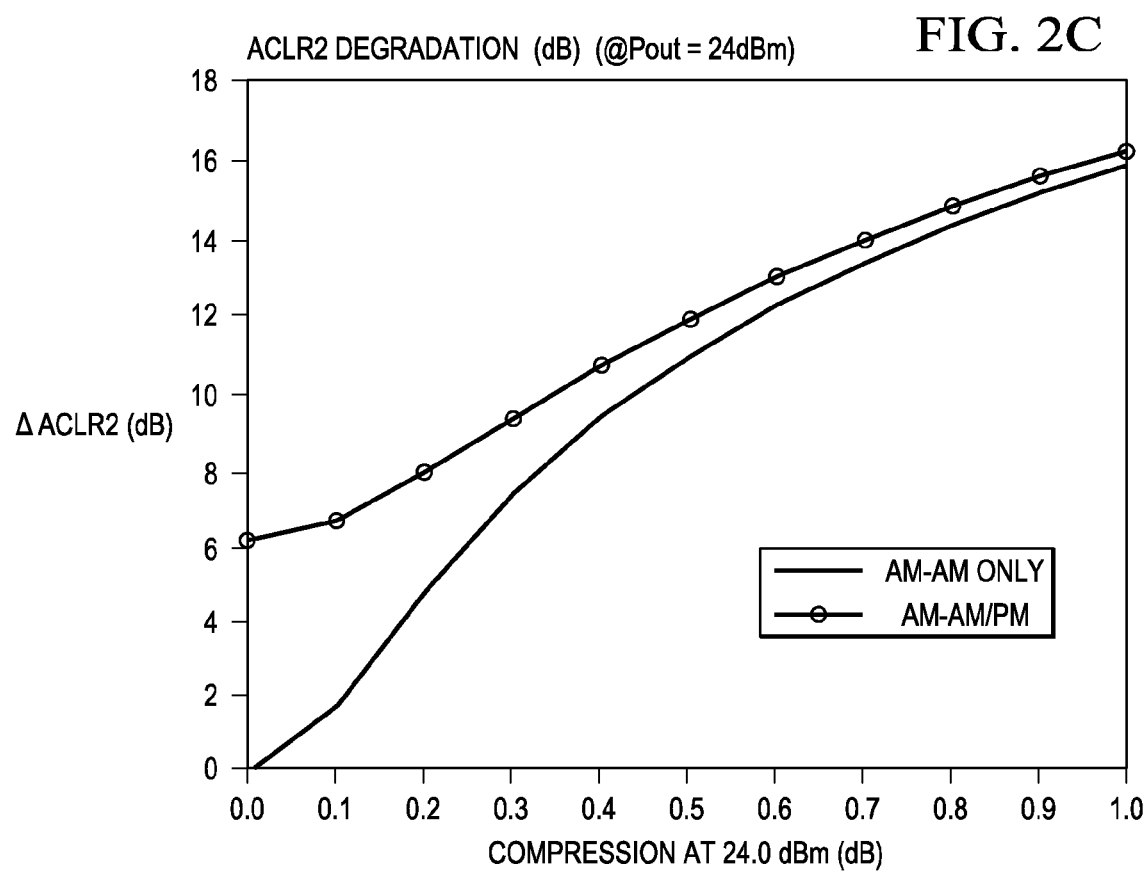

APPARATUS AND METHOD FOR ADAPTIVE POLAR TRANSMITTER LINEARIZATION AND WIRELESS TRANSMITTER EMPLOYING THE SAME

CROSS-REFERENCE TO PROVISIONAL APPLICATION

This application claims the benefit of U.S. Provisional Application Ser. No. 60/957,119, filed by Waheed, et al., on Aug. 21, 2007, entitled "Method and Apparatus for Adaptive Polar Memoryless Transmitter Linearization", commonly assigned with the invention and incorporated herein by reference.

TECHNICAL FIELD OF THE INVENTION

The invention is directed, in general, to wireless transmitters and, more specifically, to an apparatus and method for adaptive polar transmitter linearization and a wireless transmitter employing the apparatus or the method.

BACKGROUND OF THE INVENTION

Many applications exist for battery-powered, digital wireless transmitters, primarily in cellular communications systems such as those operating under the International Telecommunication Union's Wideband Code Division Multiple Access (WCDMA) standard. Such transmitters use one or more amplifiers, such as a digital pre-power amplifier (PPA) that feeds into a power amplifier (PA), to amplify components of the input signal to be transmitted. These components are amplitude and phase components in the case of a polar transmitter.

A highly linear amplifier distorts the signal the least and so is most favored from a standpoint of signal quality. Unfortunately, highly linear amplifiers use relatively large amounts of power and numbers of highly accurate components, making them relatively power consumptive, large and expensive. Though they perform the best, they are thus disfavored in many wireless applications, particularly those that require low-cost transmitters. The amplifier that is best suited overall for low-cost, battery-powered wireless transmitters is a simple amplifier having significant nonlinearities. See, for example, FIG. 1A, in which a nonlinear amplifier 110 distorts a substantially sinusoidal input signal.

Predistortion is often used to compensate for these nonlinearities, resulting in a linearization of the output of the amplifier. The theory underlying predistortion is that, if an amplifier's distortion characteristics are known in advance, an inverse function can be applied to an input signal to predistort it before it is provided to the amplifier. Though the amplifier then distorts the signal as it amplifies it, the predistortion and the amplifier distortion essentially cancel one another, resulting in an amplified, output signal having substantially reduced distortion. See, for example, FIG. 1B, in which a digital predistorter 120 predistorts the substantially sinusoidal input signal such that the output signal is likewise sinusoidal.

In digital transmitters, digital predistortion (DPD) is most often carried out using a lookup table (LUT) that associates output values with input signal values. Entries in the LUT are addressed using samples of the input signal. The output values retrieved from the LUT are used either to modify the samples (an "inverse gain" configuration) or in lieu of the samples (a "direct mapping" configuration). In modern applications such as WCDMA, samples are transmitted at a very high rate. Thus, the predistorter needs to be able to look up and retrieve output values very quickly.

WCDMA polar transmitters, which perform both amplitude modulation (AM) and phase modulation (PM), suffer nonlinearities resulting from both AM-AM and AM-PM interactions occurring in their amplifier(s). In such polar transmitters, predistortion is carried out with respect to both AM and PM components and thereby linearize the transmitters.

Values for a nominal predistortion LUT are typically computed during initial factory calibration. Unfortunately, a factory-calibrated predistortion LUT often fails to linearize the amplifier(s) adequately under varying operational conditions (e.g., temperature, voltage, frequency and voltage standing-wave ratio, or VSWR). Aging, especially in WCDMA and other so-called "3G" transmitters (e.g., Universal Mobile Telecommunications System, or UMTS), only exacerbates the inadequacy.

SUMMARY OF THE INVENTION

To address the above-discussed deficiencies of the prior art, the invention provides a polar transmitter. In one embodiment, the transmitter includes: (1) a transmit chain having a predistorter configured to employ first amplitude and phase compensation LUTs to carry out predistortion in the transmit chain, (2) a receiver coupled to the transmit chain and (3) predistortion compensation circuitry associated with the receiver and configured to update second amplitude and phase compensation LUTs associated therewith based on at least one signal from the transmit chain, the values in the updated second amplitude and phase compensation LUTs thereby available for subsequent predistortion.

Another aspect of the invention provides a method of linearizing a polar transmitter. In one embodiment, the method includes: (1) employing first amplitude and phase compensation LUTs to carry out predistortion, (2) updating second amplitude and phase compensation LUTs based on at least one signal from the transmit chain and (3) making values in the updated second amplitude and phase compensation LUTs available for subsequent predistortion.

Yet another aspect of the invention provides a WCDMA polar transmitter. In one embodiment, the WCDMA transmitter includes: (1) a transmit chain having a predistorter configured to employ first amplitude and phase calibration and compensation LUTs to carry out predistortion in the transmit chain, a pre-power amplifier coupled to the predistorter and a power amplifier coupled to the pre-power amplifier, (2) a receiver coupled to the transmit chain and (3) predistortion compensation circuitry associated with the receiver and configured to update second amplitude and phase compensation LUTs associated therewith based on at least one signal from at least one of the pre-power amplifier and the power amplifier, the values in the updated second amplitude and phase compensation LUTs thereby available for subsequent predistortion.

In another embodiment, the WCDMA transmitter includes: (1) a transmit chain having a predistorter configured to employ first amplitude and phase calibration and compensation LUTs to carry out predistortion in the transmit chain, a pre-power amplifier coupled to the predistorter and a power amplifier coupled to the pre-power amplifier, (2) a receiver coupled to the transmit chain, (3) predistortion compensation circuitry associated with the receiver and configured to update second amplitude and phase compensation LUTs associated therewith based on at least one signal from at least one of the pre-power amplifier and the power amplifier, the values in the updated second amplitude and phase compensation LUTs thereby available for subsequent predistortion, (4) an adaptation engine associated with the predistortion compensation circuitry and configured to employ an iterative adaptation algorithm to reduce a difference between delayed signals provided thereto and (5) a quality monitor associated with the adaptation engine and configured to carry out a selected one of: (5a) regulating predistortion operational parameters, (5b) enabling or disabling the adaptation engine, (5c) controlling switching of predistortion compensation LUTs and (5d) performing other sequencing operations.

BRIEF DESCRIPTION OF THE DRAWINGS

For a more complete understanding of the invention, reference is now made to the following descriptions taken in conjunction with the accompanying drawings, in which:

FIGS. 2A, 2B and 2C are plots showing the degradation caused by transmitter compression nonlinearity in a WCDMA transmitter in terms of error vector magnitude (EVM), a first adjacent channel leakage ratio at 5 MHz offset (ACLR1) and a second adjacent channel leakage ratio at 10 MHz offset (ACLR2), respectively;

DETAILED DESCRIPTION

Various embodiments of a predistortion technique for a polar transmitter will be described herein. Certain embodiments are directed to on-line, indirect learning adaptation predistortion techniques. Certain embodiments of the on-line, indirect learning adaptation predistortion technique are appropriate for a 3G (e.g., WCDMA or UMTS) polar transmitter. Of course, the technique is also applicable to 2G and 4G polar transmitters, among others. In one embodiment to be illustrated and described, the predistortion LUT that is located in the transmit chain is divided into a calibration (static) LUT and a compensation (adaptive) LUT. An adaptation algorithm determines an update to a second compensation LUT in a shadow memory. The second compensation LUT is then used in a subsequent timeslot (perhaps by a simple memory pointer change), while the (first) compensation LUT that was active in the previous timeslot is now used to compute compensation under operational transmit characteristics. A polar transmitter that incorporates embodiments of the technique and a method of linearizing a polar transmitter will also be described.

Figure 1A:
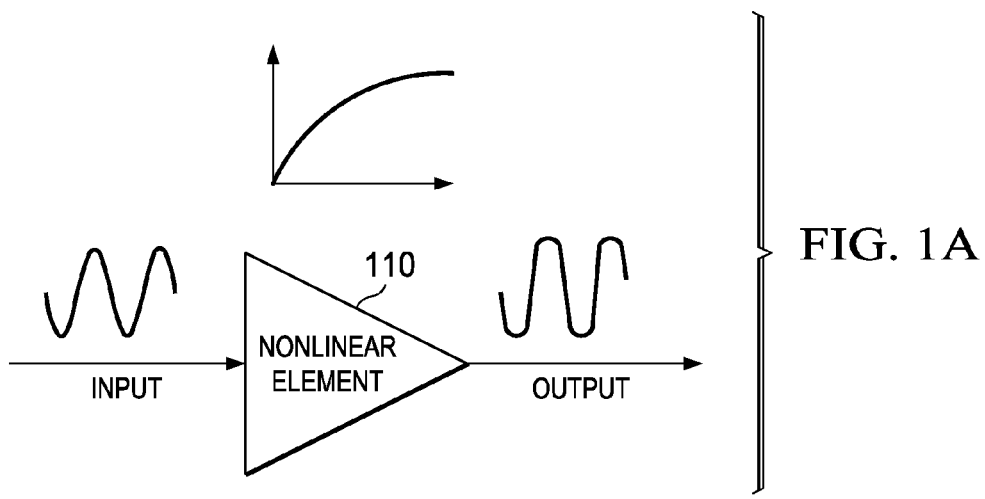
FIGS. 1A and 1B are high-level schematic diagrams showing amplifier distortion, particularly the impact of a simple compression nonlinearity on the time-domain output signal.
Figure 1B:
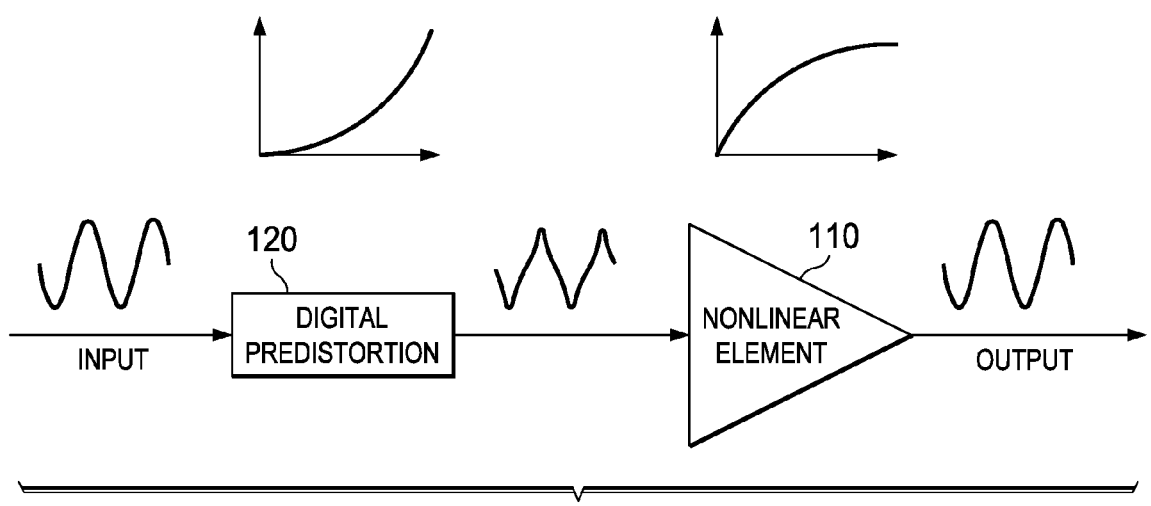
Figure 1C:
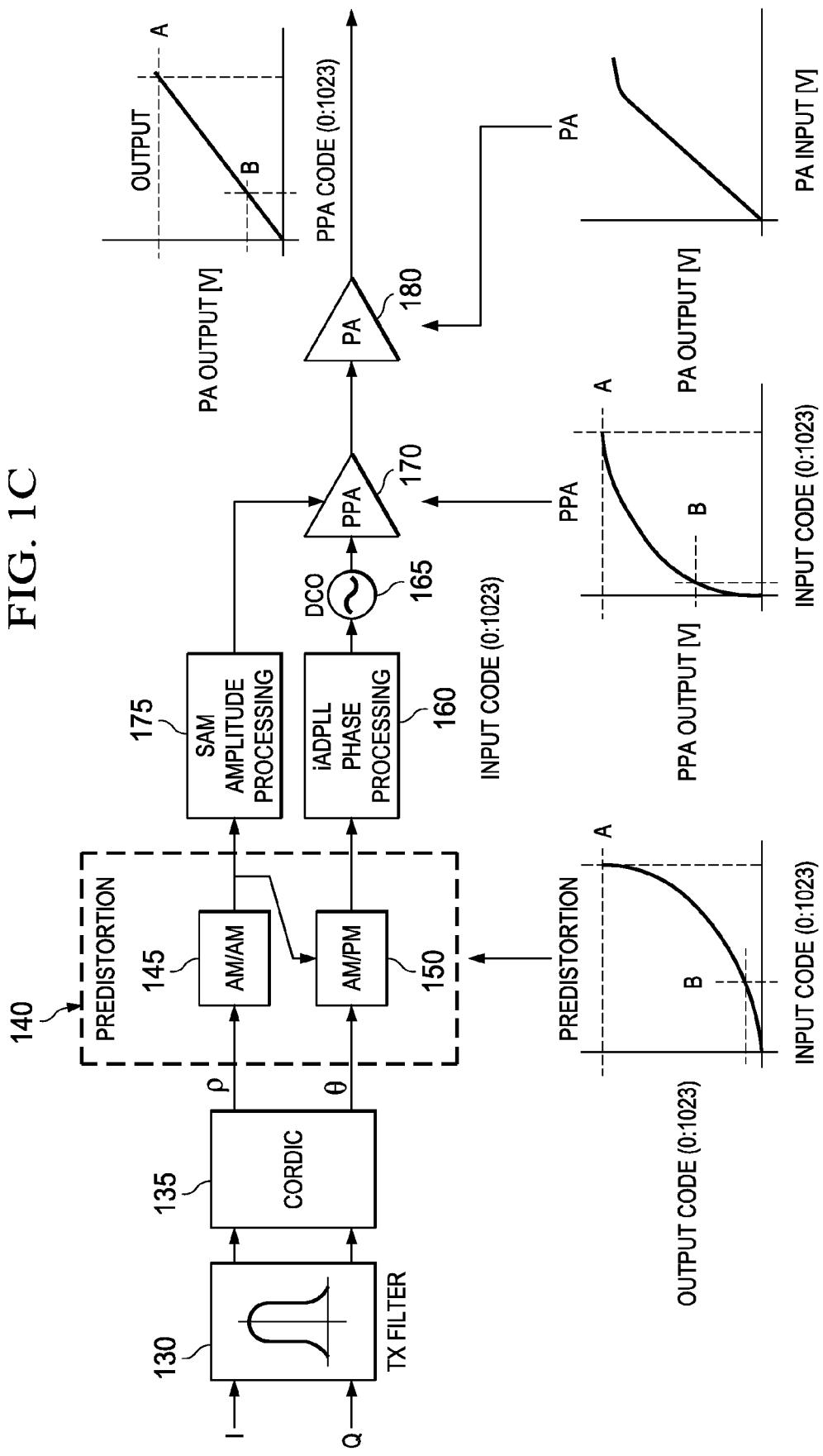
FIG. 1C is a conceptual view of one embodiment of predistortion in an example of a polar transmitter.

Before describing the various embodiments, adaptive predistortion in the context of a polar transmitter will be generally described. FIG. 1C is a block diagram of one embodiment of an adaptive indirect closed loop predistorter in an example of a polar 3G WCDMA transmitter. A transmit chain of the transmitter includes a digital baseband processor TXIQ (not shown) that produces in-phase and quadrature components I and Q. A signal processor 130 conditions I and Q for amplification. A COordinate Rotation DIgital Computer (CORDIC) 135 rotates I and Q to yield amplitude and phase components $\rho$ and $\theta$. Polar predistortion LUTs 140 (including AM/AM and AM/PM LUTS 145, 150) are employed as to produce predistorted amplitude and phase components $\rho_a$ and $\theta_a$. (FIG. 1C illustrates graphs for predistortion, distortion and resulting output curves, but those graphs only apply to AM/AM distortion. AM/PM distortion also occurs, but graphs are not illustrated therefor.) $\theta_a$ is provided to a local oscillator (LO) phase-locked loop (PLL) 160, which drives a digitally controlled oscillator (DCO) 165. The output of the DCO 165 in turn drives the PPA 170. (The PPA 170 may sometimes be referred to as a PA driver.) $\rho_a$ is provided to the amplitude signal processor 175, which the PPA 170 amplifies. A PA 180 yields the WCDMA output signal.

1 WCDMA Transmitter Linearization Budget Analysis

Figure 2A:
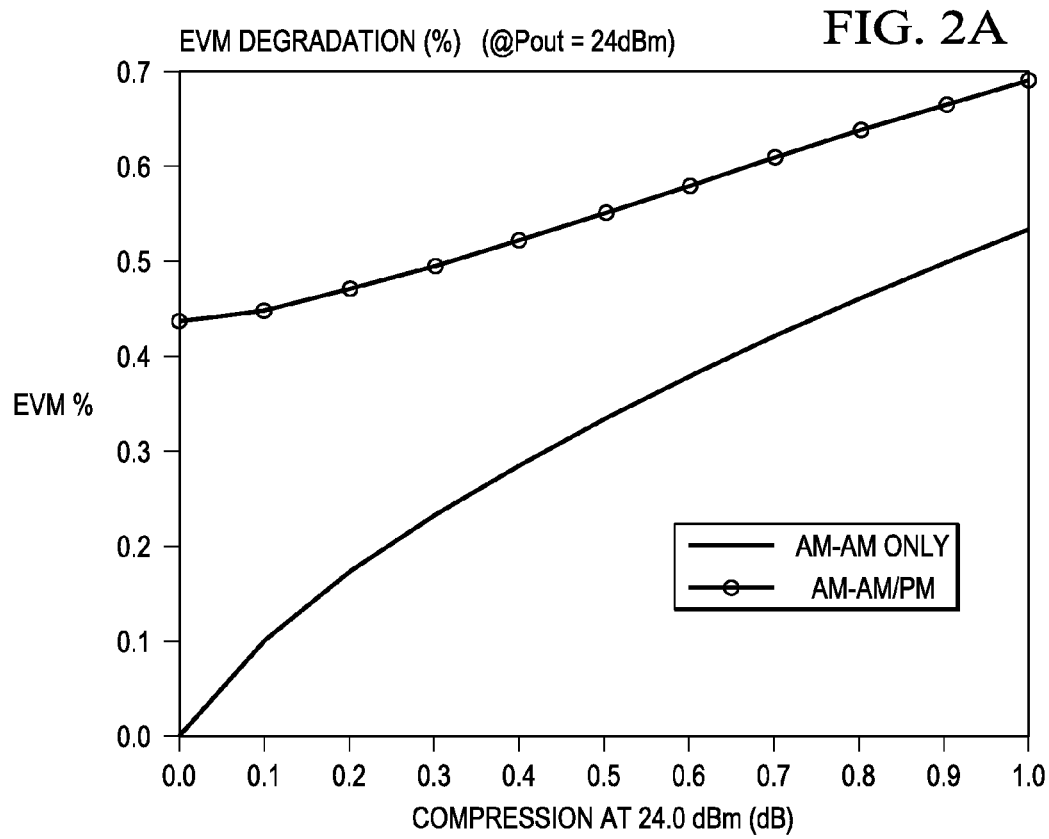
Figure 2B:
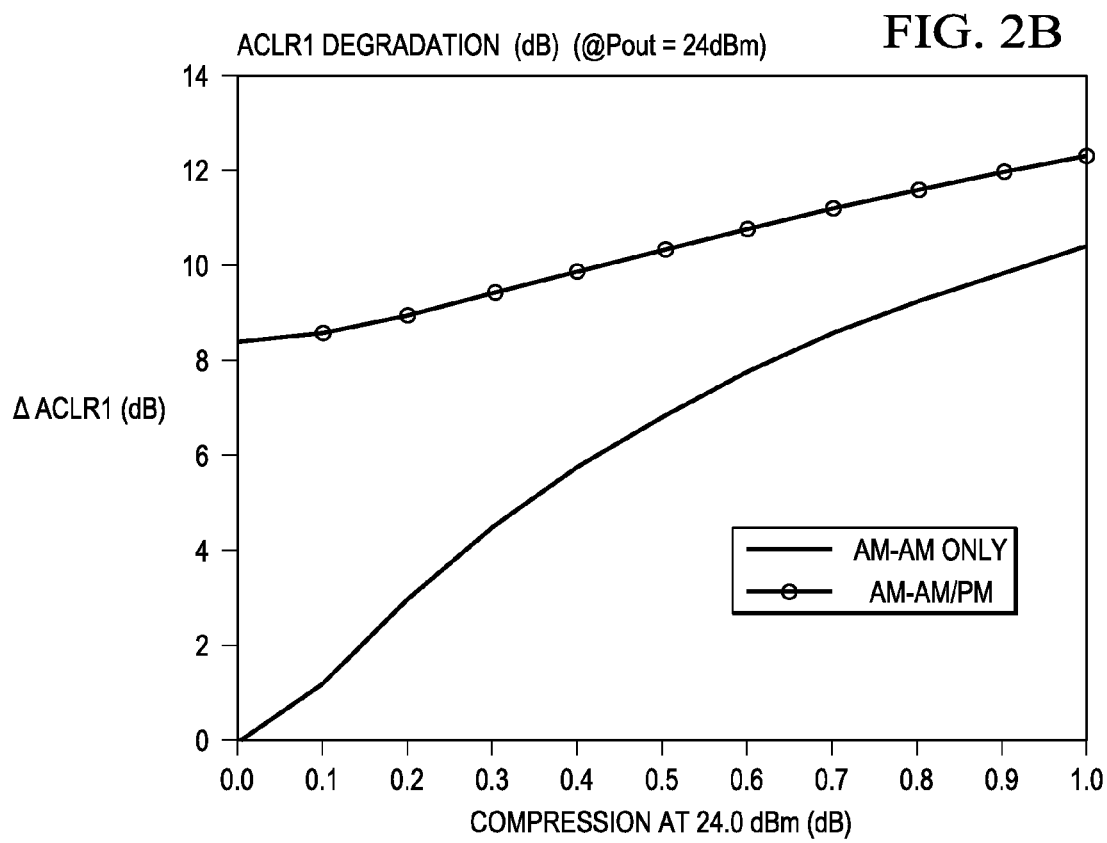

The potential effect of transmitter non-linearity on the transmitted WCDMA signal will now be described. The tolerable level of transmitter compression is determined by experimentations based on a novel AM-AM compression model and a measured PA AM-PM profile. A weakly nonlinear PA model was used to generate plots illustrating the effect of transmitter nonlinearity. EVM, ACLR1 and ACLR2 were measured as a function of the compression level at 24 dBm. FIGS. 2A, 2B and 2C are plots showing the degradation caused by transmitter compression nonlinearity in a WCDMA transmitter in terms of EVM, ACLR1 and ACLR2, respectively. The AM-PM profile was simulated by curve fitting an actual PA's AM-PM curve.

2 Predistortion Calibration

Factory predistortion calibration is typically employed to obtain the nominal behavior of a PPA or a PPA/PA combination and thereby to construct nominal AM/AM and AM/PM predistortion LUTs.

In predistortion calibration, a ramping signal DTX is injected into the amplifier. The ramping signal typically covers the entire range of the PPA input and has the same number of steps as the size of the predistortion LUTs. Each step typically is of sufficient duration to allow the transmitter and receiver to settle. The transmitted and received data are then used to construct the calibrated predistortion LUTs.

Predistortion calibration also provides valuable information for predistortion compensation. For example, from the measurement data, the order of the polynomial that is adequate for representing the nominal nonlinearity of one or a combination of amplifiers can be determined. Calibrating under varying operating conditions yields a better estimate of the order of the compensation polynomial to be used for incremental predistortion changes due to temperature, frequency, voltage and VSWR.

3 Adaptive Predistortion Compensation

An adaptive predistorter suitable for use with a 3G WCDMA polar transmitter will now be described.

3.1 Algorithm Description

The predistorter adaptation employs a receiver that feeds back a fraction of the transmitted WCDMA signal to a processor (e.g., a script processor). The receiver may be a main receiver of the transceiver that is time-shared to provide feedback or a auxiliary receiver that is separate from the main receiver. The latter is particularly advantageous in a duplex system, such as WCDMA. The predistorter employs static correction (via the calibration LUT) calibrated for nominal temperature operation, and an adaptive compensation (via the compensation LUT) that tracks the characteristics variations due to temperature fluctuations. Both the calibrated and compensated portions of the predistorter are implemented using LUTs.

The feedback of the transmitted signal may also be configured to compensate for any output and load impedance mismatches. This might be carried out using a set of directional couplers or a mechanism of appropriate load (or antenna) impedance tuning, which provides the information as auxiliary feedback to the adaptive predistorter.

Two learning architectures will now be described, a direct learning architecture, and an indirect learning architecture.

3.1.1 Direct-Learning Architecture

Figure 3:
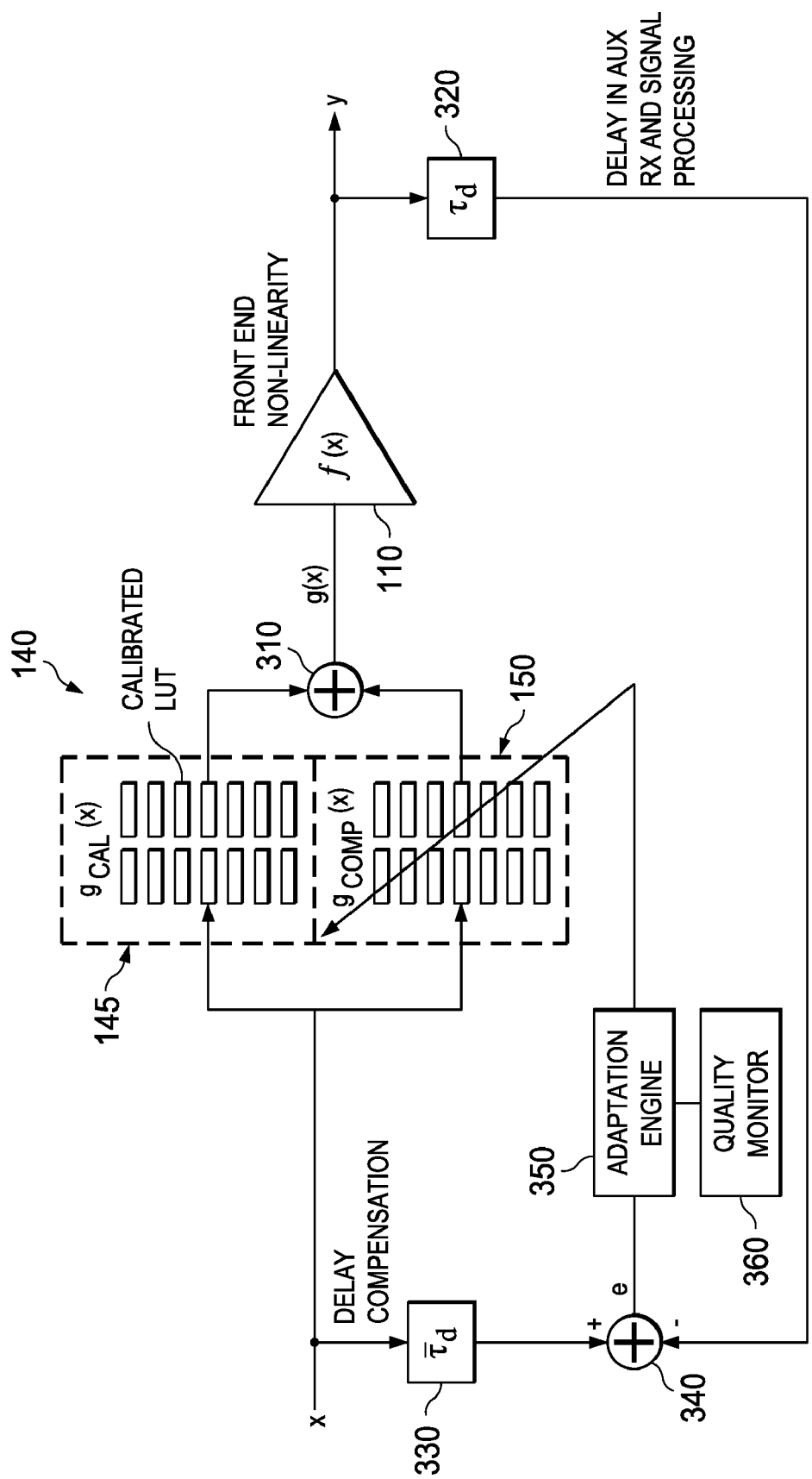
FIG. 3 is a conceptual view of one embodiment of a predistorter that employs direct learning.

FIG. 3 is a conceptual view of one embodiment of a direct learning architecture. An input signal x is provided to predistortion LUTs 140, including a calibration LUT $g_{cal}(x)$ 145 and a compensation LUT $g_{comp}(x)$ 150. The outputs of the LUTs 145, 150 are summed in a summing junction 310 and provided as input to a nonlinear element 110, which provides an output signal y. A receiver, which may be an auxiliary receiver, feeds back the output signal y, incurring some delay. An output delay circuit $\bar{\tau}_d$ 320 represents that delay. An input delay circuit $\tau_d$ 330 delays x by an equivalent amount, and a summing junction 340 provides the difference between the two delayed signals to an adaptation engine 350. The adaptation engine 350 uses an iterative adaptation algorithm to update the compensation LUT $g_{comp}(x)$ 150 to minimize the difference. Examples of such iterative adaptation algorithms include, but are not limited to, stochastic gradient, least-mean-square (LMS) or recursive least squares (RLS) algorithms. The compensation predistorter is adapted during transmission. The state of the compensation predistorter continually changes until a steady state is reached, when the feedback error reaches zero.

A quality monitor 360 interacts with the adaptation engine 350. In the embodiment of FIG. 3, the quality monitor 360 is an adaptive predistortion supervisory control block which may regulate the predistortion operational parameters, enable or disable the adaptation engine, control the switching of predistortion compensation LUTs as well as perform other sequencing operations of the predistortion adaptation loop. The predistortion controller may be implemented in hardware or more conveniently as firmware on an available processor, which may be available on-chip. The quality monitor 360 may use metrics including, but not limited to, transmitted power level, transceiver output impedance variations, transceiver load impedance variations and VSWR, SNR or other quality metrics of the receiver feedback signal to control the predistortion operation. Such changes to the predistortion loop may include but are not limited to the change of the adaptation step-size, tuning of reference and feedback signal time-alignment, enabling or disabling predistortion adaptation and/or keeping or discarding predistortion adaptation results to meet transmitter performance goals.

The direct learning architecture has the advantage of low memory requirements, but updating the compensated LUT at each sample step while it is used for predistortion can lead to technical implementation issues that are difficult to overcome. Furthermore the transmission chain is directly exposed to the spurious signals and interference signals that are fed back through the receiver.

3.1.2 Indirect-Learning Architecture

Figure 4:
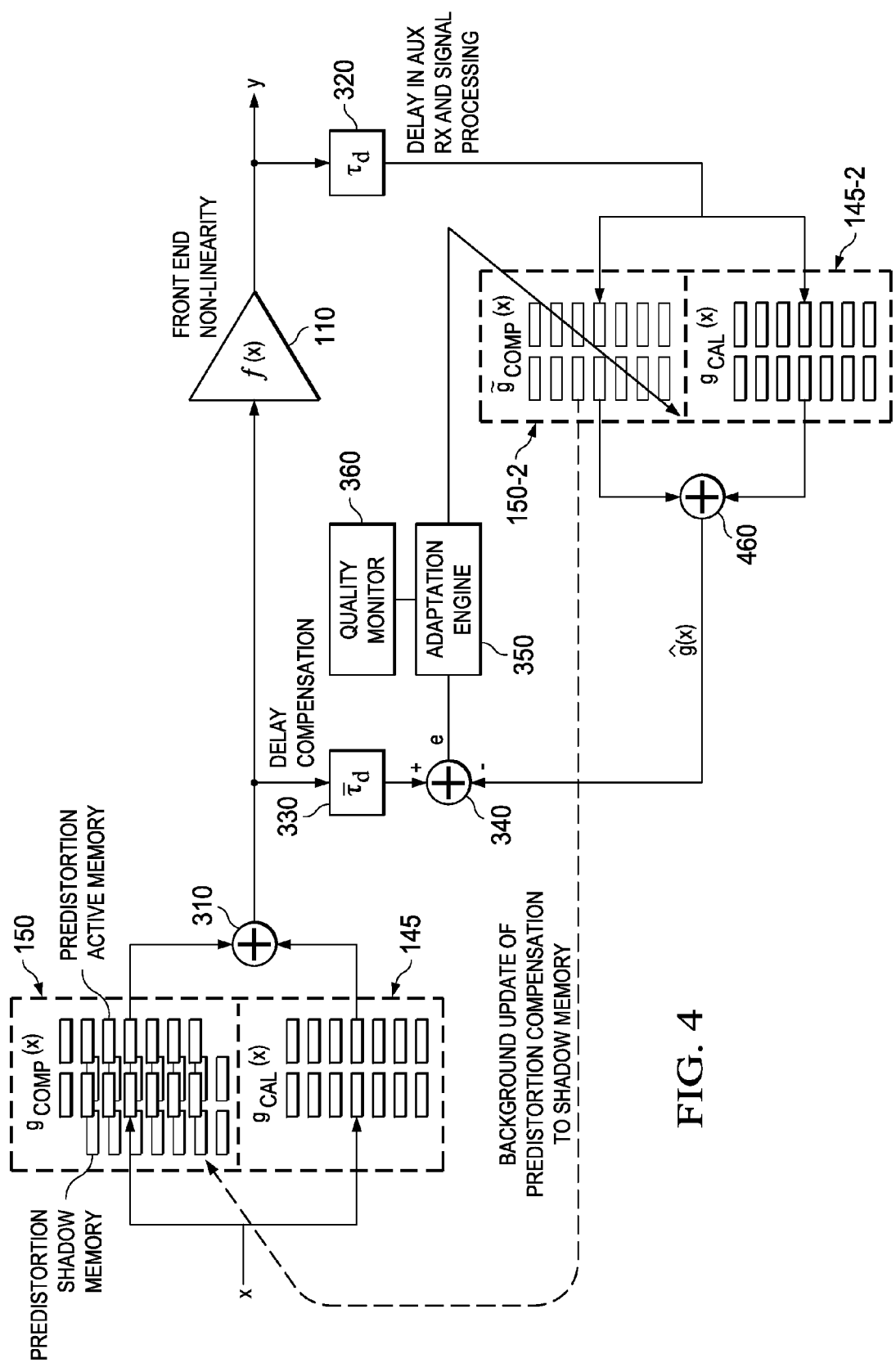
FIG. 4 is a conceptual view of one embodiment of a predistorter that employs indirect learning.

FIG. 4 is a conceptual view of one embodiment of indirect learning. Again, an input signal x is provided to predistortion LUTs 140, including a first calibration LUT $g_{cal}(x)$ 145 and a first compensation LUT $g_{comp}(x)$ 150. The outputs of the first calibration and compensation LUTs 145, 150 are summed in a summing junction 310 and provided as input to a nonlinear element 110, which provides an output signal y. A receiver feeds back the output signal y, incurring some delay. An output delay circuit $\bar{\tau}_d$ 320 represents that delay. An input delay circuit $\tau_d$ 330 delays the output of the summing junction 310 by an equivalent amount. However, unlike the direct learning architecture, the indirect learning architecture includes a second calibration LUT $g_{cal}(x)$ 145-2 and a second compensation LUT $\tilde{g}_{comp}(x)$ 150-2. The outputs of the second calibration and compensation LUTs 145-2, 150-2 are summed in a summing junction 460, yielding $\hat{g}(x)$. A summing junction 340 provides the difference between the two delayed signals to a quality monitor 350. As before, the adaptation engine 350 uses an iterative adaptation algorithm to update the compensation LUT $g_{comp}(x)$ 150 to minimize the difference. As before, the compensation predistorter is adapted during transmission. The state of the compensation predistorter continually changes until a steady state is reached, when the feedback error reaches zero. After the steady state is reached, the second compensation LUT $\tilde{g}_{comp}(x)$ 150-2 is substituted for the first compensation LUT $g_{comp}(x)$ 150. The substitution is made, or the first compensation LUT 150 is updated at selected time instants, and only when full convergence is reached.

In an indirect learning architecture, the transmission chain is insulated from the receiver's strong interference signals as those can be detected and isolated by the adaptation engine 350. Further, though the indirect learning architecture requires more memory to accommodate the first and second sets of LUTs, the decoupling between the transmit chain and the adaptation feedback loop relaxes timing requirements, allowing more flexible processing on the part of, e.g., a processor (not shown).

Figure 5:
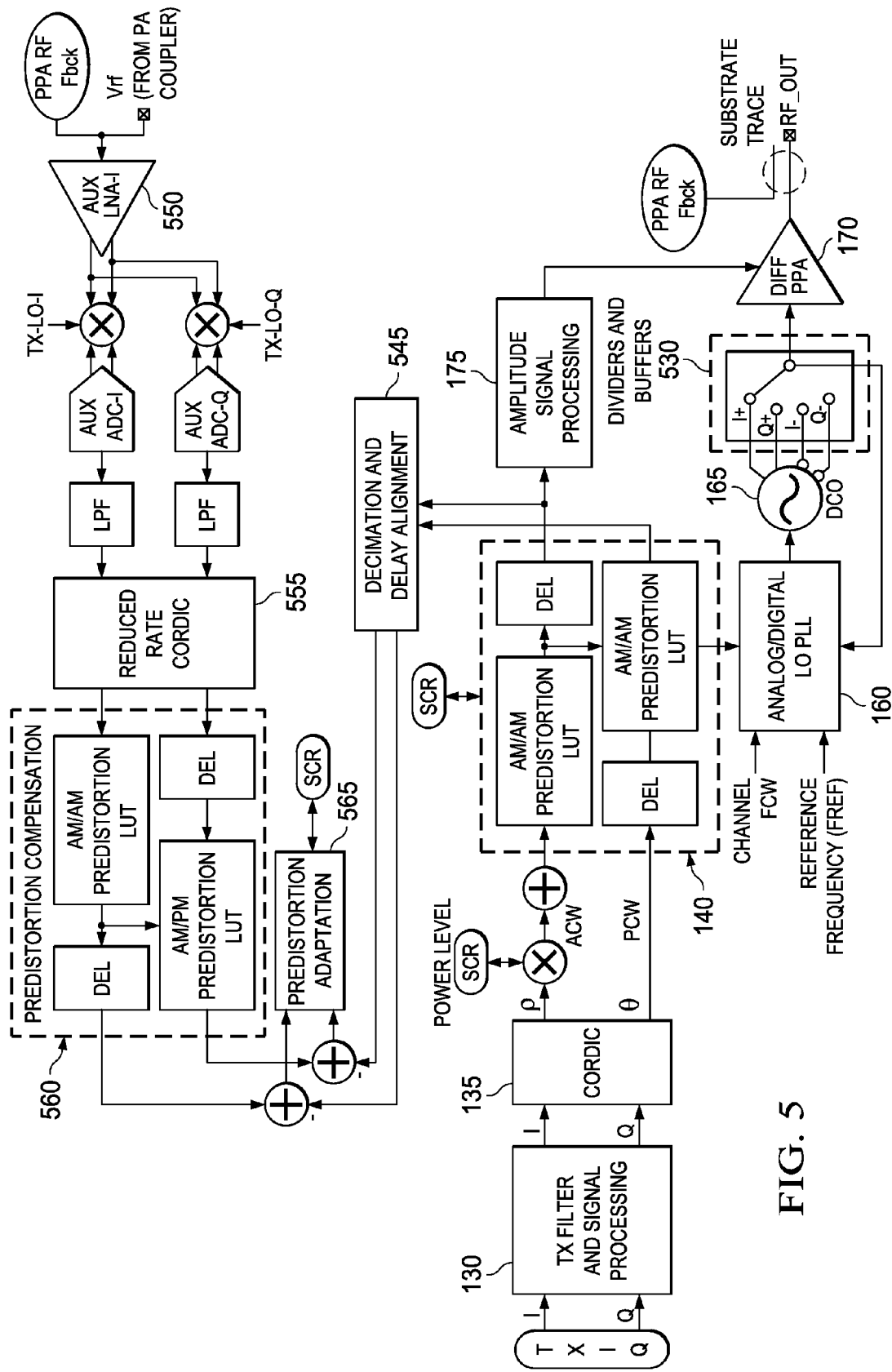
FIG. 5 is a block diagram of one embodiment of an adaptive indirect closed loop predistorter in an example of a polar 3G WCDMA transmitter.

Now a particular embodiment of the indirect learning architecture will be described. FIG. 5 is a block diagram of one embodiment of an adaptive indirect closed loop predistorter in an example of a polar 3G WCDMA transmitter. A transmit chain of the transmitter includes a digital baseband processor TXIQ (not shown) that produces in-phase and quadrature components I and Q. The signal processor 130 conditions I and Q for amplification. The CORDIC 135 rotates I and Q to yield amplitude and phase components ρ and θ. First polar predistortion LUTs 140 (having four LUTs—two calibration LUTs and two compensation LUTs—in the illustrated embodiment) are employed as they were in FIG. 1C to produce predistorted amplitude and phase components $\rho_a$ and $\theta_a$. $\theta_a$ is provided to the LO PLL 160, which drives the DCO 165. Dividers and buffers 530 receive, divide and delay differential I and Q clock signals, which are used to drive the PPA 170. $\rho_a$ is provided to the amplitude signal processor 175, which the PPA 170 amplifies. The PA, which FIG. 5 does not show, yields the WCDMA output signal. $\rho_a$ and $\theta_a$ are also provided to a decimator and aligner 545 to be used in temperature adaptation, which will now be described.

A coupler (not referenced) provides a portion of $v_o$ to the input of a receiver. The receiver employs a low-noise amplifier (LNA) 550 to yield in-phase and quadrature components I and Q of $v_o$, which are downconverted, converted to digital form and filtered as shown and then rotated by another CORDIC 555 into amplitude and phase components ρ and θ. Second polar predistortion LUTs 560 (having four LUTs—two calibration LUTs and two compensation LUTs—in the illustrated embodiment) predistort ρ and θ to yield amplitude and phase components. The differences between these amplitude and phase components and those provided via the decimator and aligner 545 are provided to a predistortion adapter 565 which updates predistortion in the compensation LUTs of the second polar predistortion LUTs 560. The second polar predistortion LUTs 560 are then exchanged with the first polar predistortion LUTs 140 for the next lookup. The first polar predistortion LUTs 560 are updated during that next lookup, the first and second polar predistortion LUTs 140, 560 are exchanged again for the lookup after that, and so on.

3.2 Simulation Model

Figure 6:
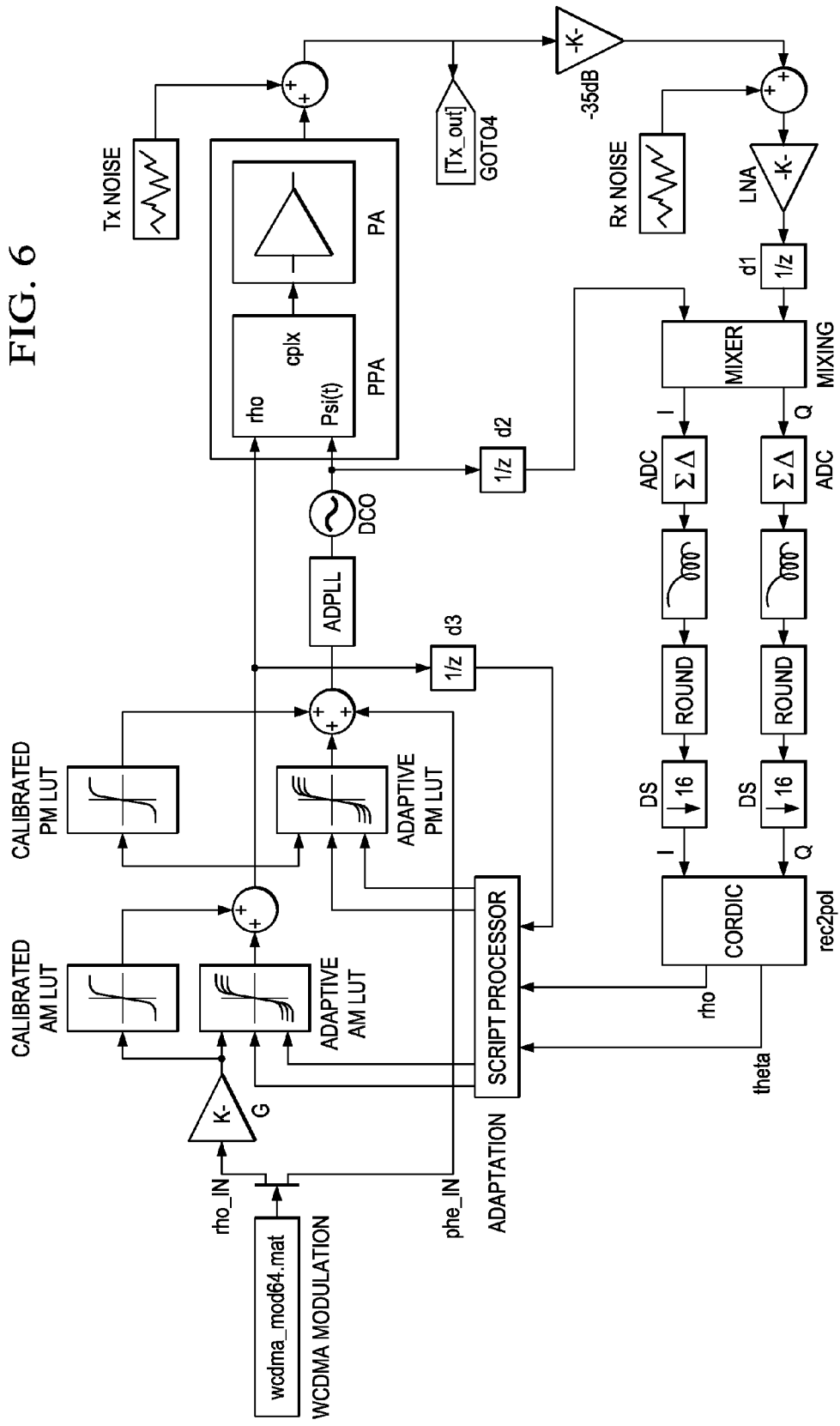
FIG. 6 is a simulation model of the polar 3G WCDMA transmitter of FIG. 5.

The performance of the embodiment of FIG. 5 will be described below. FIG. 6 is a simulation model of the polar 3G WCDMA transmitter of FIG. 5 that will form the basis for simulations that indicate the performance of an embodiment of an on-line, indirect learning adaptation predistortion technique.

3.3 Adaptation Algorithm

One embodiment of an update algorithm for the indirect-learning architecture shown in FIG. 4 will now be described. The predistortion LUTs are modeled as one dimensional arrays indexed by an integer address n. Each LUT is N words large, with V being the maximum amplitude addressable by the LUT. The elements are of the LUT are designated by LUT[n] with n∈{1,2, . . . ,N}.

$G_{cal}$ and $\tilde{G}_{comp}$ respectively represent the calibration LUT and the compensation LUT for the amplitude path. $P_{cal}$ and $\tilde{P}_{comp}$ respectively represent the calibration LUT and the compensation LUT for the phase path. The illustrated embodiment does not interpolate LUT accesses in the update loop. It has been found that interpolation further complicates the update equations shown below without providing any performance improvement in a 3G transmitter. However, alternative embodiments may employ linear or other interpolation to advantage in some applications.

$r_p[k]$ and $\theta_p[k]$ represent sampled discrete amplitude and phase signals at the input of the amplifier, and $r_f[k]$ and $\theta_f[k]$ represent corresponding feedback amplitude and phase signals at the receiver. It is assumed that delay alignment has already been performed and the output amplitude is normalized by the gain of the amplifier and the feedback path.

3.3.1 Updating Amplitude LUT:

For every output sample $r_f[k]$, the corresponding LUT address $n_k$ is computed as described below:

$$n_k = \text{Round}\left[\frac{S(r_f[k])}{V} \times (N-1)\right],$$

where S(r) is the companding function used to achieve arbitrary LUT spacing. For uniform spacing, S(r) is the identity function S(r)=r.

The corresponding LUT error is computed as:

$$e_r[k] = r_p[k] - G_{cal}[n_k] - \tilde{G}_{comp}[n_k].$$

The adaptive amplitude LUT $\tilde{G}_{comp}$ is updated as follows:

$$G_{comp}[n_k] = \tilde{G}_{comp}[n_k] + \mu \times e_r[k].$$

The parameter μ is an update factor which, for the purposes of discussion, is chosen to be 0.25. A lower value could be considered, perhaps depending on the receiver SNR.

3.3.2 Updating the Phase Compensation LUT

Figure 7:
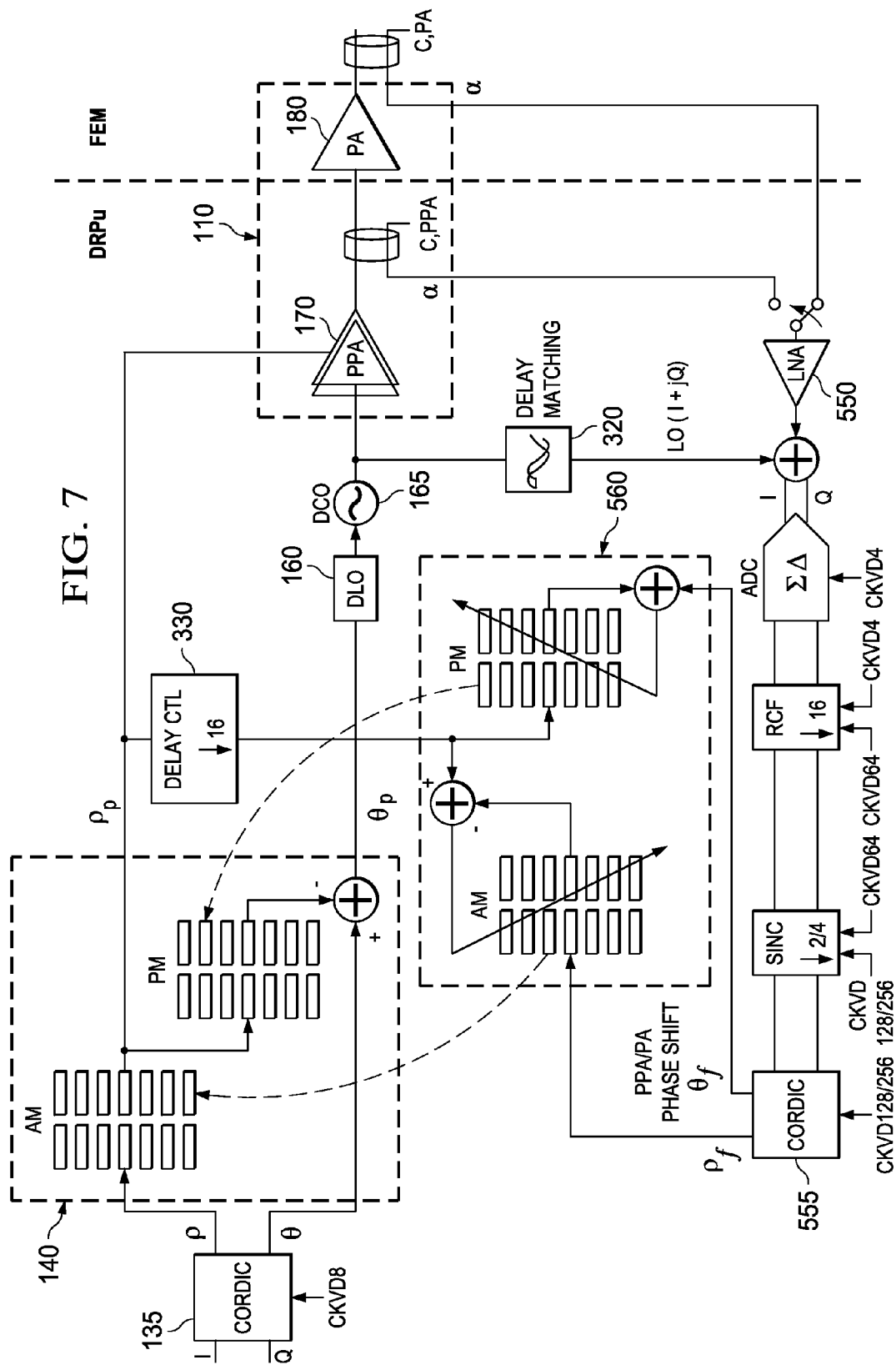
FIG. 7 is a conceptual view of one embodiment of predistorter adaptation in a polar transmitter carried out using input addressing.

Two alternative embodiments of updating the phase LUT will now be described: input addressing and output addressing. FIG. 7 is a conceptual view of one embodiment of predistorter adaptation in a polar transmitter carried out using input addressing. The phase LUT is addressed using the PA's input amplitude via the input delay circuit 330, and the amplitude LUT is addressed using the output amplitude via the receiver:

$$m_k = \text{Round}\left[\frac{S(r_p[k])}{V} \times (N-1)\right].$$

The shadow LUT $\tilde{P}_{comp}$ is updated as follows:

$$P_{comp}[n_k] = (1-\mu) \times \tilde{P}_{comp}[n_k] + \mu \times (\theta_p[k] - \theta_f[k])$$

Figure 8:
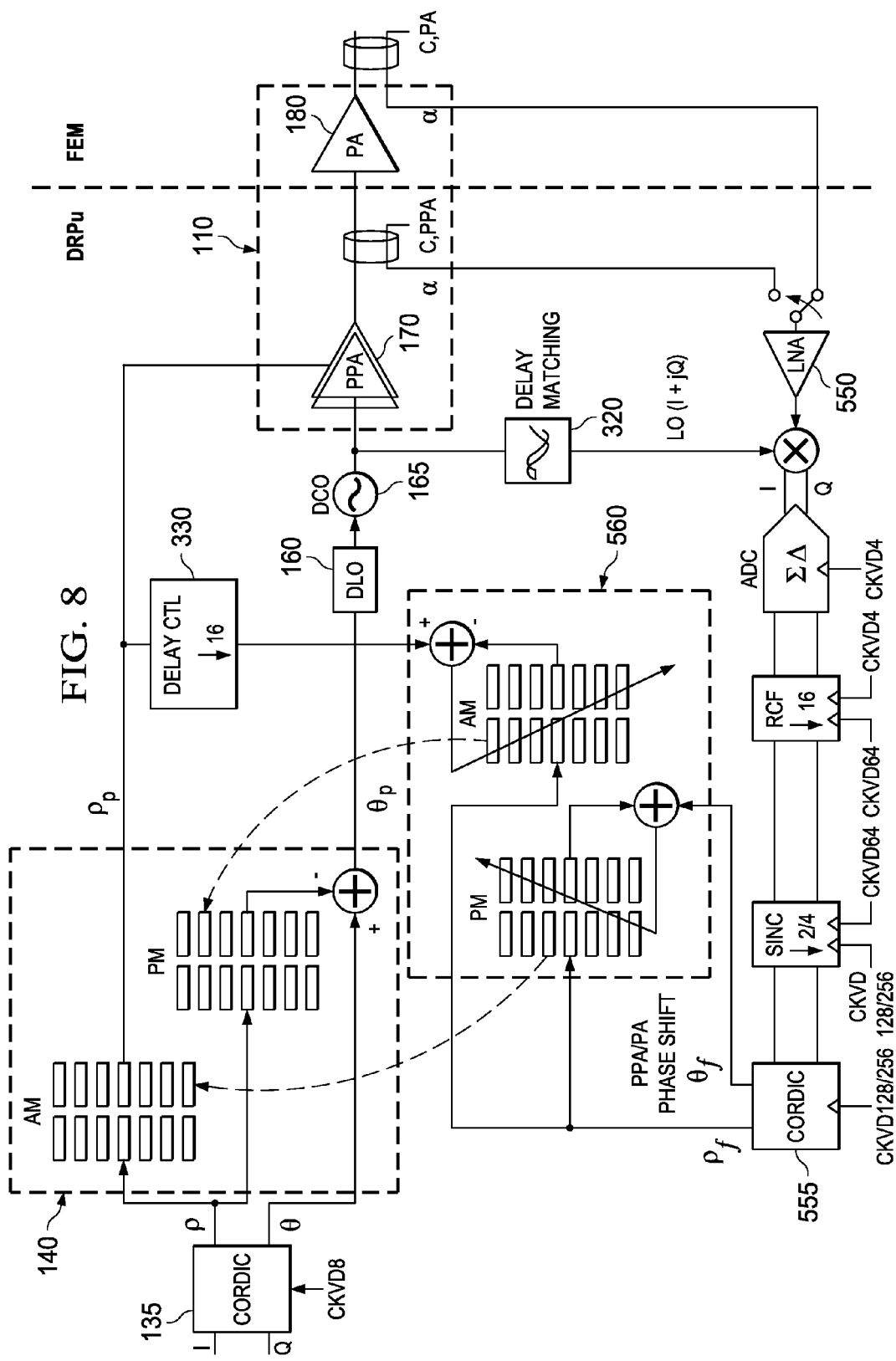
FIG. 8 is a conceptual view of one embodiment of predistorter adaptation in a polar transmitter carried out using output addressing.

FIG. 8 is a conceptual view of one embodiment of predistorter adaptation in a polar transmitter carried out using output addressing. Both of the LUTs are addressed using the PA's output amplitude via the receiver (including the LNA 550 and the CORDIC 555:

$$n_k = \text{Round}\left[\frac{S(r_f[k])}{V} \times (N-1)\right].$$

The update error is:

$$e_\theta[k] = \theta_p[k] - \theta_f[k] - P_{cal}[n_k] - \tilde{P}_{comp}[n_k].$$

The adaptive phase LUT $\tilde{P}_{comp}$ is updated as follows:

$$\tilde{P}_{comp}[n_k] = \tilde{P}_{comp}[n_k] + \mu \times e_\theta[k].$$

Only a slight performance difference was observed between the input and output addressing methods. If output addressing is used, the amplitude and phase LUT in the feed-forward predistorter should be parallel instead of cascaded.

Additionally, if the same spacing is used for both the amplitude and phase LUTs, only a single address calculation unit is required as opposed to two for the cascaded case.

The update equations shown above require limited computation. The address calculation is the most critical step in terms of algorithm complexity. An appropriate companding function may be employed to minimize the overall complexity.

Figure 9:
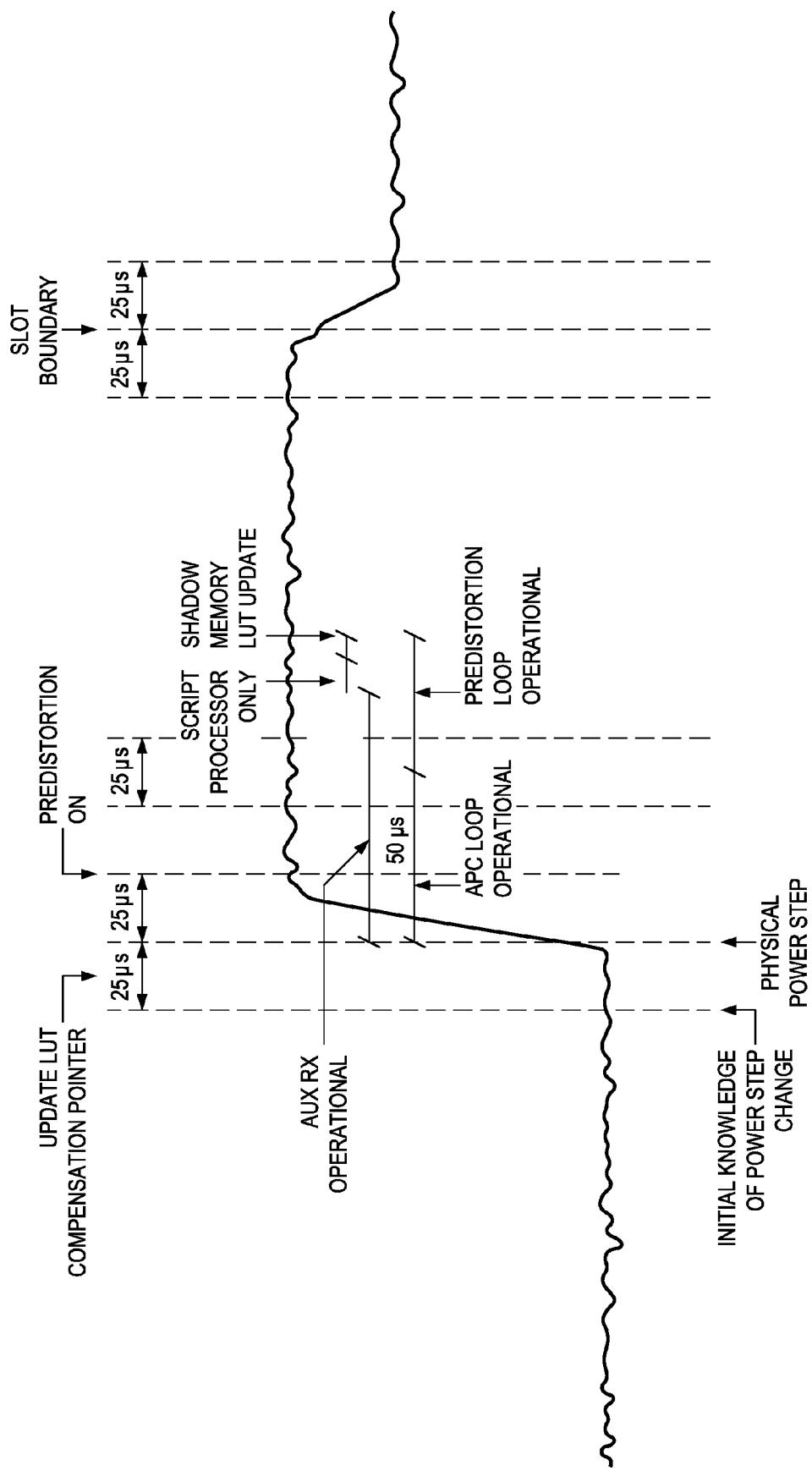
FIG. 9 is an example of a predistortion timeline.

3.4 Predistortion Timeline:

FIG. 9 is an example of a predistortion timeline. As is evident, the compensated LUT is updated at power level transition points, taking advantage of relaxed spectral requirements during power control steps. The predistortion adaptation loop may, for example, be activated 50 µs after the beginning of the new timeslot for a duration that may be determined. The shadow memory is updated afterwards, and the compensation pointer may then be updated at the next time slot boundary.

3.5 Impact of Sampling Rate on Algorithm Convergence

Figure 10:
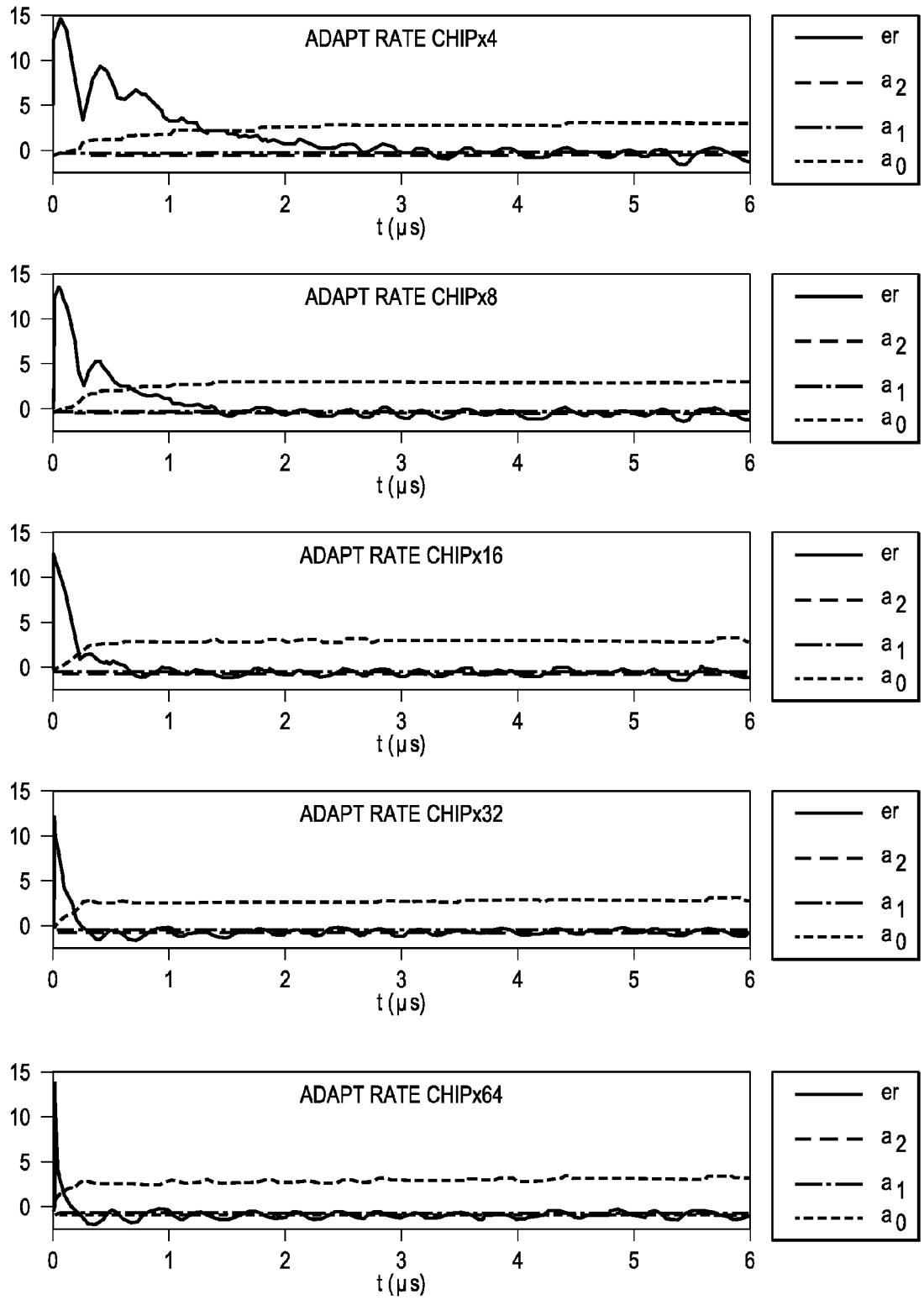
FIG. 10 is a plot showing one example of the impact of predistortion compensation loop speed on learning time.

The sampling rate Fs and adaptation factor µ equally affect the adaptation convergence rate. The convergence time is maintained as long as µ×Fs is constant. FIG. 10 is a plot showing one example of the impact of predistortion compensation loop speed on learning time. FIG. 10 below shows the adaptation error and polynomial coefficients convergence for various sampling rates.

4 Mathematical Analysis of PPA/PA Predistortion Information Extraction for a Polar Transmitter If $A_{AM}(t)$ represents the amplitude modulation signal input to the PPA and $\theta_{PM}(t)$ represents the total phase modulation fed into the PPA, the PPA output can then be written as:

$$Y_{PPA}(t) = G_{PPA}(A_{AM}(t)) \cdot \cos(\omega_c t + \theta_{PM}(t) + \phi_{PPA}(t)),$$

where $G_{PPA}(\cdot)$ and $\phi_{PPA}(t)$ are the PPA's AM/AM and AM/PM respectively.

For purposes of the analysis, a 3 dB pad, with a time-invariant attenuation $\beta_{PAD}$, is assumed to exist at the output of the PPA. For the PA, if $G_{PA}(\cdot)$ and $\phi_{PA}(t)$ are assumed to represent the AM/AM and AM/PM contribution by the PA, the signal at the PA output can be written as:

$$Y_{PA}(t) = G_{PA}(\beta_{PAD} \cdot G_{PPA}(A_{AM}(t))) \cdot \cos(\omega_c t + \theta_{PM}(t) + \phi_{PPA}(t) + \phi_{PA}(t)).$$

If the coupling from the transmitter to the receiver is also assumed to be time-invariant (specified as $\alpha_{RF}$), the transmitter signal at the input of the receiver LNA can be written as:

$$Y_{RF}(t) = \alpha_{RF} \cdot G_{PA}(\beta_{PAD} \cdot G_{PPA}(A_{AM}(t))) \cdot \cos(\omega_c t + \theta_{PM}(t) + \phi_{PPA}(t) + \phi_{PA}(t)).$$

With an LNA/TA gain of $G_{LNA}$, the signal fed to the IQ mixer is given by:

$$Y_{LNA}(t) = G_{LNA} \cdot \alpha_{RF} \cdot G_{PA}(\beta_{PAD} \cdot G_{PPA}(A_{AM}(t))) \cdot \cos(\omega_c t + \theta_{PM}(t) + \phi_{PPA}(t) + \phi_{PA}(t)).$$

Defining $A_{LNA}(t) = G_{LNA} \alpha_{RF} \cdot G_{PA}(\beta_{PAD} \cdot G_{PPA}(A_{AM}(t)))$, the LNA output can be re-written as:

$$Y_{LNA}(t) = A_{LNA}(t) \cdot \cos(\omega_c t + \theta_{PM}(t) + \phi_{PPA}(t) + \phi_{PA}(t)).$$

The downconversion input to the mixer being provided by the transmitter local oscillator is:

$$Y_{TXLO}(t) = A_{TXLO} \cdot \exp\{j(\omega_c(t - t_d) + \theta_{PM}(t - t_d))\},$$

where $t_d$ is the additional time delay in the coupled RF signal (from either the PPA or the PA). Focusing on the signal in the receiver I path only for convenience:

$$V_I(T) = Y_{LNA}(t) \cdot A_{TXLO} \cdot \cos(\omega_c(t - t_d) + \theta_{PM}(t - t_d))\}$$

$$= A_{LNA}(t) \cdot A_{TXLO} \cdot \cos(\omega_c t + \theta_{PM}(t) + \phi_{PPA}(t) + \phi_{PA}(t)) \cdot$$

$$\cos(\omega_c(t - t_d) + \theta_{PM}(t - t_d)).$$

Expanding and simplifying the above expression for the I signal, the following results:

$$V_I(T) = \frac{A_{LNA}(t) \cdot A_{TXLO}}{2} \cdot \left[ \begin{array}{l} \left\{\cos\left(\begin{array}{l} \omega_c t_d + \theta_{PM}(t) - \theta_{PM}(t - t_d) + \\ \phi_{PPA}(t) + \phi_{PA}(t) \end{array}\right)\right\} + \\ \left\{\cos\left(\begin{array}{l} \omega_c(2t - t_d) + \theta_{PM}(t) + \\ \theta_{PM}(t - t_d) + \phi_{PPA}(t) + \phi_{PA}(t) \end{array}\right)\right\} \end{array} \right].$$

The second expression in the above equation is at a high frequency and can be filtered out relatively easily, therefore expanding the first term yields:

$$V_I(T) =$$

$$\frac{A_{LNA}(t) \cdot A_{TXLO}}{2} \cdot \left[ \begin{array}{l} \cos\left(\begin{array}{l} \omega_c t_d + \theta_{PM}(t) - \\ \theta_{PM}(t - t_d) \end{array}\right) \cdot \cos(\phi_{PPA}(t) + \phi_{PA}(t)) - \\ \sin\left(\begin{array}{l} \omega_c t_d + \theta_{PM}(t) - \\ \theta_{PM}(t - t_d) \end{array}\right) \cdot \sin(\phi_{PPA}(t) + \phi_{PA}(t)) \end{array} \right].$$

Correspondingly, for the Q signal:

$$V_Q(T) = \frac{A_{LNA}(t) \cdot A_{TXLO}}{2} \cdot$$

$$\left[ \begin{array}{l} \cos\left(\begin{array}{l} \omega_c t_d + \theta_{PM}(t) - \\ \theta_{PM}(t - t_d) \end{array}\right) \cdot \sin(\phi_{PPA}(t) + \phi_{PA}(t)) + \\ \sin\left(\begin{array}{l} \omega_c t_d + \theta_{PM}(t) - \\ \theta_{PM}(t - t_d) \end{array}\right) \cdot \cos(\phi_{PPA}(t) + \phi_{PA}(t)) \end{array} \right].$$

In both above expressions, the first term on the right-hand side is the desired component, while the second term is the undesired component.

For a reasonable estimation of the predistortion, the contribution from the second term should be at least 10 dB smaller than the desired term. Also, since $\theta_{PM}(t_d) \ll \omega_c t_d$, modulation in the signal is not a major impediment.

$$\frac{A_{LNA}(t) \cdot A_{TXLO}}{2} =$$

$$A_{TXLO} \cdot G_{LNA} \cdot \alpha_{RF} \cdot$$

$$\frac{G_{PA}(\beta_{PAD} \cdot G_{PPA}(A_{AM}(t)))}{2} = G_{P\_loop} \cdot G_{PA}(\beta_{PAD} \cdot G_{PPA}(A_{AM}(t))),$$

where $G_{P\_loop} = \frac{1}{2} \cdot A_{TXLO} \cdot G_{LNA} \cdot \alpha_{RF}$ is a constant term, called predistortion loop gain, and $G_{PA}(\beta_{PAD} \cdot G_{PPA}(A_{AM}(t)))$ is the cumulative AM/AM distortion in the PPA and PA.

4.1.1 Case I: Transmitter Local Oscillator Perfectly Time-Aligned with the Transmitter Leakage Signal at Receiver Mixture This is the ideal case, where the transmitter local oscillator is perfectly time aligned to the transmitter leakage signal being downconverted, i.e., $t_d=0$. In this case, the recovered receiver I/Q signals are:

$$V_I(T) \cong G_{P\_loop} \cdot G_{PA}(\beta_{PAD} \cdot G_{PPA}(A_{AM}(t))) \cdot [\cos(\phi_{PPA}(t) + \phi_{PA}(t))] \text{ and}$$

$$V_Q(T) \cong G_{P\_loop} \cdot G_{PA}(\beta_{PAD} \cdot G_{PPA}(A_{AM}(t))) \cdot [\sin(\phi_{PPA}(t) + \phi_{PA}(t))].$$

When the leakage is due to the PPA only, the I and Q signals recovered from receiver are:

$$V_I(T) \cong G_{P\_loop} \cdot G_{PPA}(A_{AM}(t)) \cdot [\cos(\phi_{PPA}(t))] \text{ and}$$

$$V_Q(T) \cong G_{P\_loop} \cdot G_{PPA}(A_{AM}(t)) \cdot [\sin(\phi_{PPA}(t))]$$

4.1.2 Case II: Transmitter Local Oscillator Not Perfectly Time-Aligned with the Transmitter Signal at Receiver Mixture.

Under these conditions, transmitter local oscillator cannot perfectly downconvert the transmitter leakage signals, i.e., $t_d \neq 0$. However, to ascertain fidelity of measurement and for the contributions from the undesired component of the signal to be insignificant with respect to the desired signal, the condition can be expressed as:

$$\left| \frac{\sin(\omega_c t_d + \theta_{PM}(t_d))}{\cos(\omega_c t_d + \theta_{PM}(t_d))} \right| < \varepsilon.$$

Assuming $t_d$ is small enough, a linear approximation can be used to simplify the equation:

$$\theta_{PM}(t - t_d) \approx \theta_{PM}(t) - t_d \frac{\partial \theta_{PM}(t)}{\partial t} \approx \theta_{PM}(t) - t_d \omega_M(t),$$

where $\omega_M(t)$ is the frequency modulation.
The condition above can then be simplified to:

$$\left| \frac{\sin((\omega_c + \omega_M)t_d)}{\cos((\omega_c + \omega_M)t_d)} \right| < \varepsilon,$$

where $\varepsilon$ is a constant chosen based on the predistortion accuracy requirements. To have the undesired component contribution to be 10 dB below the desired signal, this translates to:

$$20 \cdot \log_{10} |\tan((\omega_c + \omega_M(t))t_d)| < -10 \text{ dB}.$$

Since $\omega_M(t) \ll \omega_c$, the above expression is equivalent to:

$$20 \cdot \log_{10} |\tan(\omega_c t_d)| < -10 \text{ dB}.$$

For an 1800 MHz signal, $\omega_c = 2\pi(1800e6)$, to satisfy the above equation requires $t_d < 25$ ps.

Since tan( ) is a periodic function, the condition can be satisfied whenever:

$$k * T_c - 25 \text{ ps} < t_d < k * T_c + 25 \text{ ps with } T_c = \frac{\pi}{\omega_c}.$$

This is valid as long as $k*T_c$ is still small enough so that the linear approximation above remains valid. Note the effect of delay.

assuming the peak EDGE phase modulation signal to be less than 600 kHz. To satisfy the above equation requires $t_d < 8.5$ ps.

4.2 Simulation Analysis of Transmitter Local Oscillator/Transmitter-Leakage Time Alignment Requirements for Convergence in Polar Transmitter The LO delay mismatch manifests itself through the degradation of the overall receiver SNR. If the LO signal is perfectly aligned with the receiver signal, the error-free baseband signal after demodulation is given by:

$$y(t) = A(r(t))e^{(j\phi_{PA}(r(t)))},$$

where A and $\phi$ are the AM-AM and AM-PM response of the PA (combined nonlinearity). If an oscillator delay mismatch $t_d$ exists, the derivation in section 4 shows that the output of the receiver is:

$$\tilde{y}(t) = A(r(t))e^{j(\phi_{PA}(r(t)) + \omega_c t_d + e_\theta[k])},$$

where $\omega_c t_d$ is a constant-phase bias term that does not affect the performance of the predistorter, and $e_\theta(t) = \theta(t) - \theta(t - t_d)$ is a time varying phase error. At first order approximation $\theta(t - t_d)$ can be evaluated as:

$$\theta(t - t_d) \approx \theta(t) - t_d \times \theta'(t) = \theta(t) - t_d 2\pi f(t),$$

where $f(t)$ is the frequency modulation signal. Therefore the phase error can be computed:

$$e_\theta(t) \approx t_d \times 2\pi f(t).$$

The equivalent discrete model (sampling at Fs) is:

$$e_\theta[k] \approx t_d \times 2\pi f_k.$$

$w_k = 2\pi f_k$ is a discrete random variable having statistics that depend solely on the WCMDA modulated signal and can be estimated experimentally. The estimated mean and variance of $w_k$ for a single code WCMDA signal is shown below:

$$\mu_w \approx 0, \text{ and}$$

$$\sigma_w^2 \approx 5.552 \times 10^{12}.$$

The mean squared phase error is therefore given by:

$$\sigma_{e_\theta}^2 = t_d^2 \times \sigma_w^2.$$

The variance of the phase noise is proportional to $t_d^2$. The relation between the phase error and the equivalent receiver SNR degradation can be derived. If the term $w_c t_d$ is ignored or included as part of the transmitter's AM-PM response, the following relationship results:

$$\tilde{y}_k = A(r_k)e^{j(\phi_{PA}(r_k) + e_\theta[k])}.$$

At first order approximation:

$$\tilde{y}_k = A(r_k)e^{j(\phi_{PA}(r_k) + e_\theta[k])}$$
$$\approx A(r_k)(e^{j\phi_{PA}(r_k)} + e_\theta[k] \times je^{j\phi_{PA}(r_k)})$$
$$\approx A(r_k)e^{j\phi_{PA}(r_k)} + A(r_k)e_\theta[k] \times je^{j\phi_{PA}(r_k)}$$
$$\approx y_k + A(r_k)e_\theta[k] \times e^{j(\phi_{PA}(r_k) + \frac{\pi}{2})}.$$

Therefore, the LO delay is equivalent to an additive correlated noise of:

$$e_{LO} = A(r_k)e_\theta[k] \times e^{j(\phi_{PA}(r_k) + \frac{\pi}{2})} = t_d \omega_k A(r_k) \times e^{j(\phi_{PA}(r_k) + \frac{\pi}{2})}.$$

This result can also be obtained using a geometric approach. The above equation shows that the LO delay mismatch is equivalent to an additive colored noise which is proportional to the product of the distorted amplitude envelope and the frequency modulation. Therefore the low pass filtering during the adaptation process cannot reduce the effect of this noise component (i.e., reducing the adaptation factor will not improve the steady state performance). The mean squared alignment error is:

$$E[|e_{LO}|^2] = E[e_{LO} \times e_{LO}^*] = E[A(r_k)^2 \times e_\theta^2].$$

If $A(r_k)$ and $e_\theta$ are assumed to be independent:

$$E[|e_{LO}|^2] = E[A(r_k)^2] \times E[e_\theta^2] = \sigma_r^2 \times t_d^2 \times \sigma_w^2.$$

Therefore the SNR degradation caused by the LO misalignment is given by:

$$\delta_{SNR} = \frac{\sigma_r^2}{E[|e_{LO}|^2]} = \frac{1}{t_d^2 \times \sigma_w^2}.$$

This formula has been experimentally validated.

Figure 11:
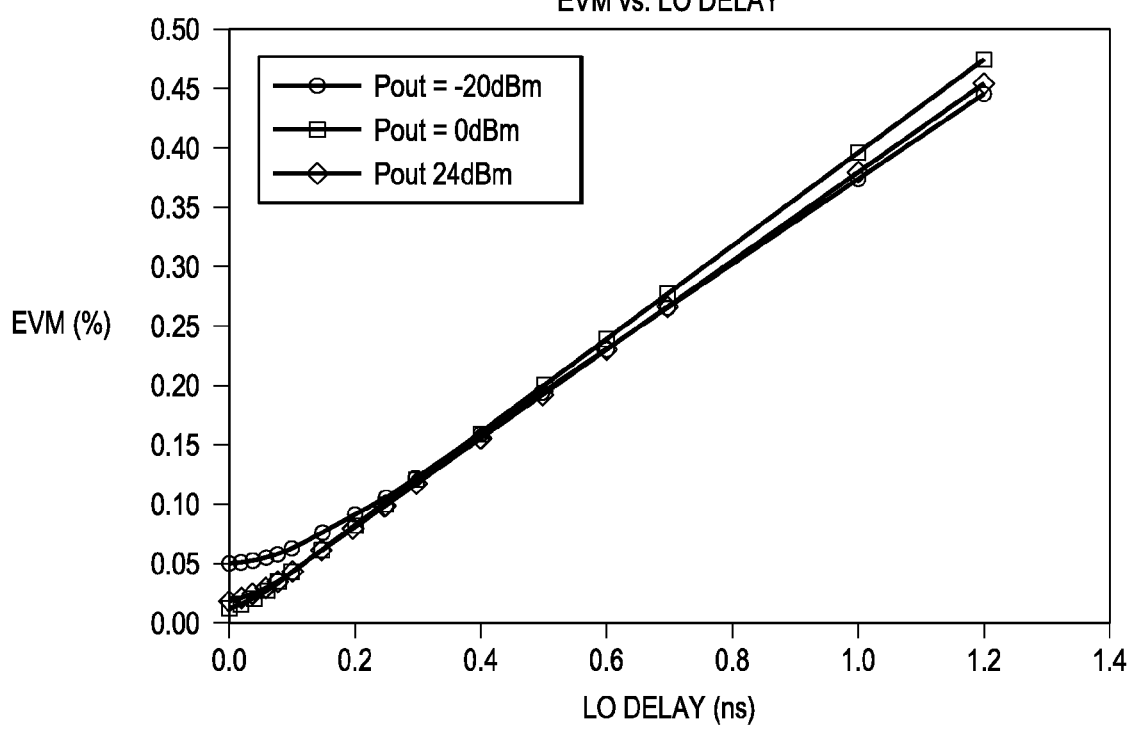
FIG. 11 is a plot showing one example of EVM as a function of local oscillator (LO) alignment delay in one embodiment of a polar transmitter.
Figure 12:
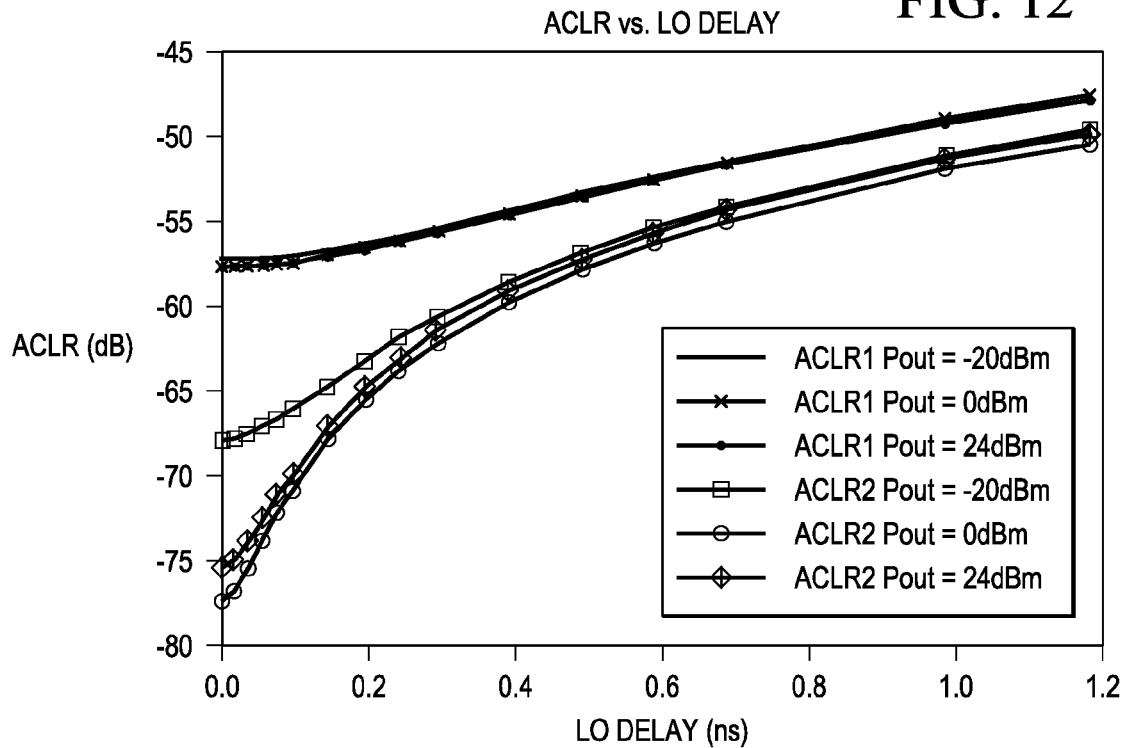
FIG. 12 is a plot showing an adjacent channel leakage ratio (ACLR) as a function of LO alignment delay in one embodiment of a polar transmitter.

The adaptive predistorter performance has been experimentally studied for different LO delays $t_d$ ranging from 0 to 1 ns. FIGS. 11 and 12 are plots showing one example of EVM and ACLR as a function of LO alignment delay in one embodiment of a polar transmitter. The additional receiver noise power is maintained at −103 dBm. The results show that the LO may be established at less than 0.4 ns for satisfactory predistorter adaptation.

5 Performance Impact of Transmitter Output Power Level

The effect of the output power level on the predistorter adaptation will now be described. The received signal is corrupted by an additive noise of approximately 103 dBm occupying a 5 MHz bandwidth (implying a noise power spectral density of approximately 170 dBm/Hz). The transmitter's output power is varied from 24 dBm to −35 dBm. The experiments were run for five different value of the update factor μ. A value of μ=0 means that adaptation is turned off. The nominal predistorter is calibrated for a temperature of 25° while the initial operating temperature is set to 125°.

Figure 13:
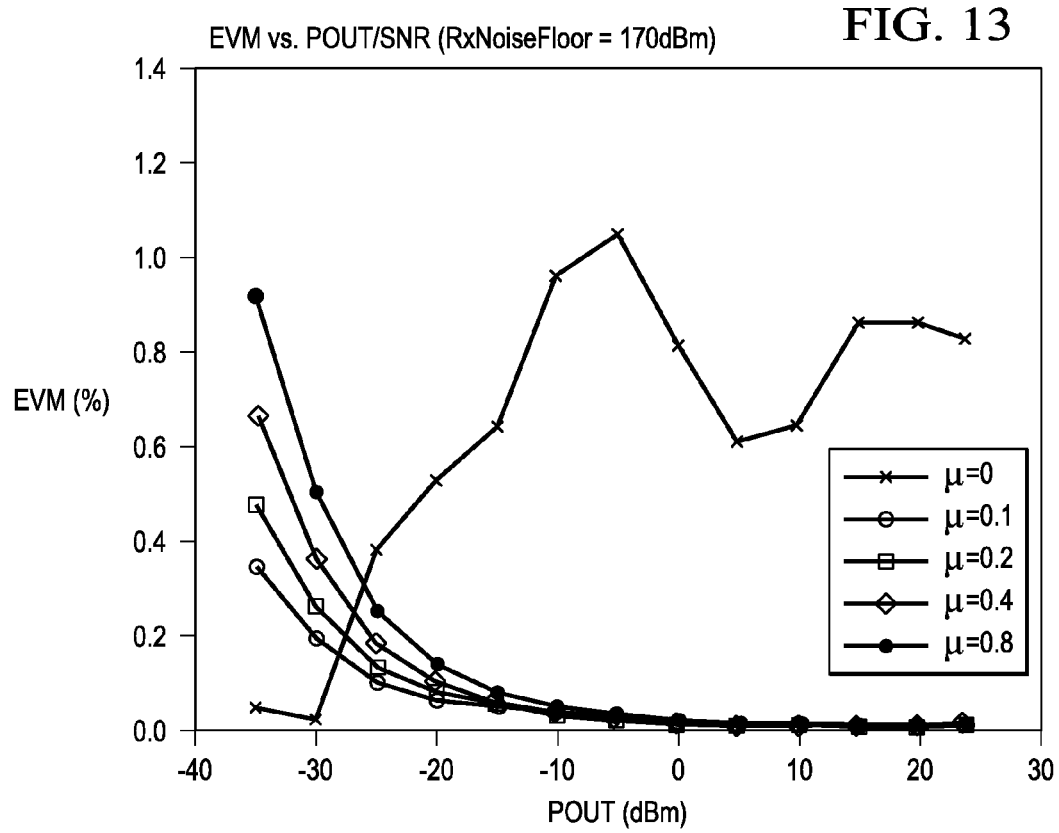
FIG. 13 is a plot showing EVM as a function of power level in one embodiment of a polar transmitter.
Figure 14:
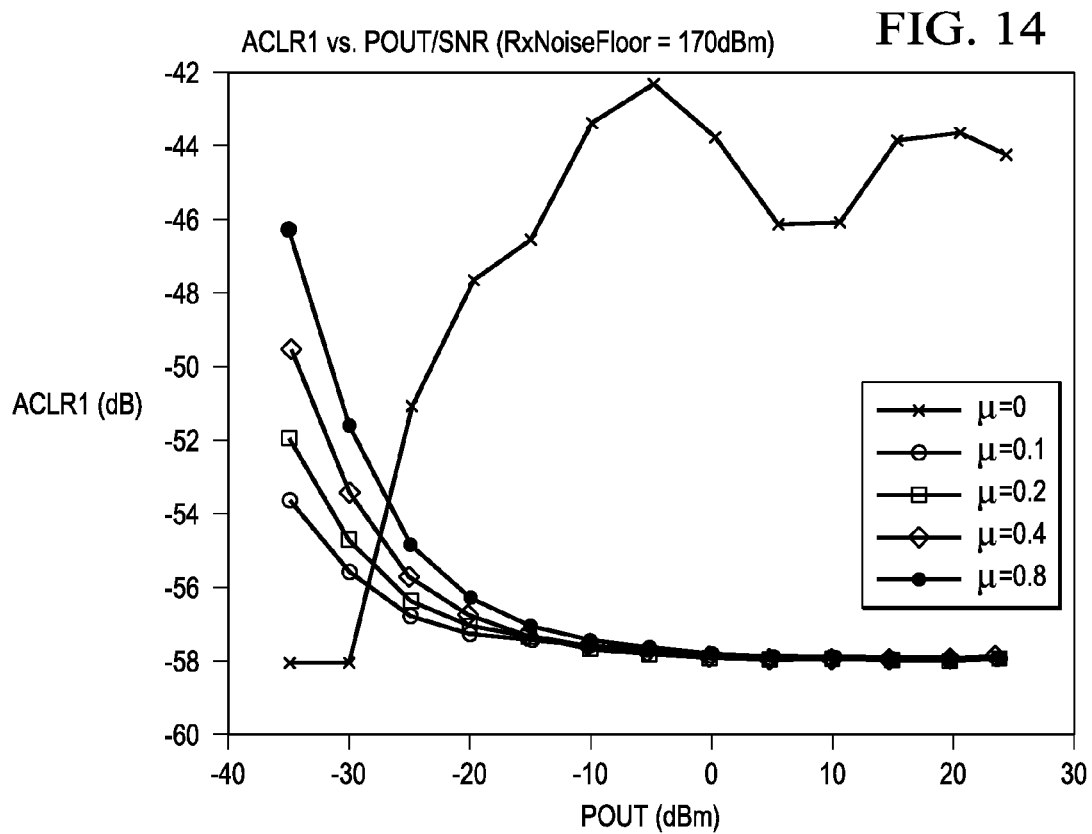
FIG. 14 is a plot showing ACLR1 as a function of power level in one embodiment of a polar transmitter.
Figure 15:
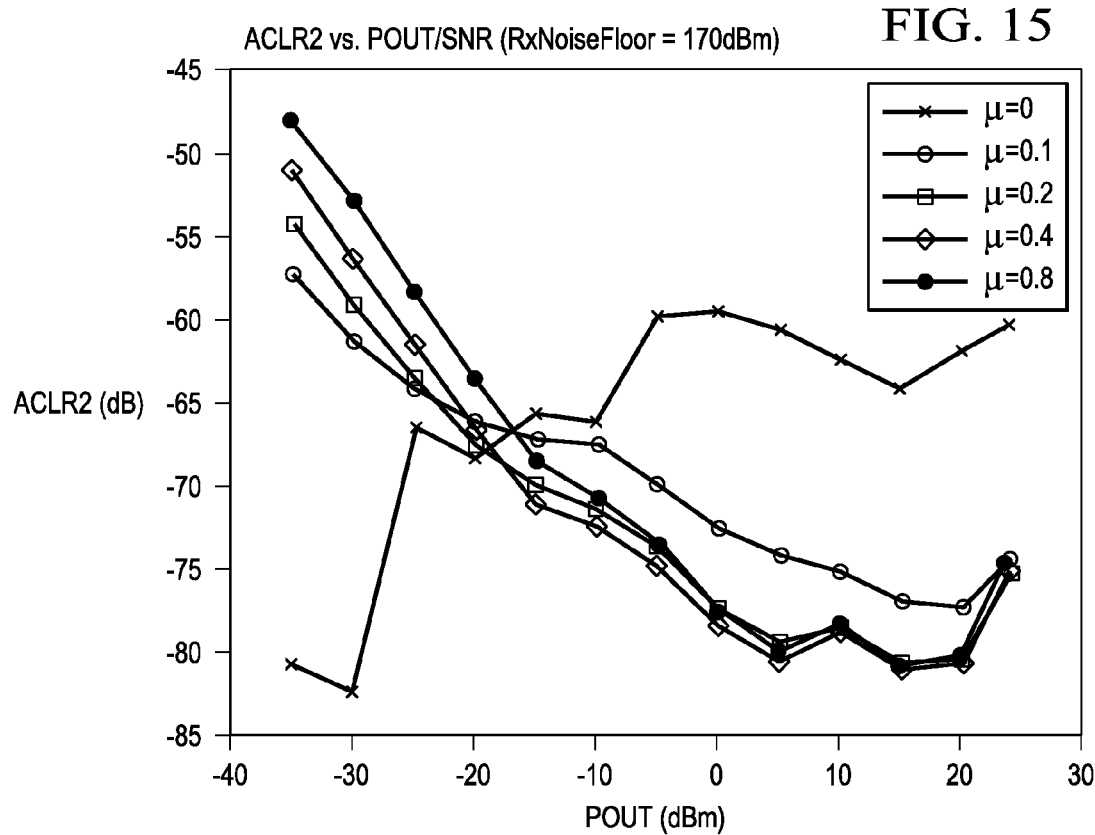
FIG. 15 is a plot showing ACLR2 as a function of power level in one embodiment of a polar transmitter.

FIGS. 13, 14 and 15 are plots respectively showing EVM, ACLR1 and ACLR2 as a function of power level in one embodiment of a polar transmitter. In the absence of adaptation, EVM, ACLR1 and ACLR2 are significantly degraded at higher power levels. In one embodiment, the predistorter should be adapted for power levels greater than −25 dBm. Decreasing the adaptation factor improves the steady state performance.

6 SNR Requirements on the Feedback Path

The SNR requirements depend mainly on the adaptation sampling rate and the update factor. The update algorithm acts like a low pass filter with respect to the noisy receiver feedback signal. Assuming the receiver is subject to additive white noise, a higher sampling rate results in a lower noise floor (dBm/Hz) and reduced noise power after filtering. On the other hand, decreasing the update factor narrows the filter's passband, resulting in a filtering of a larger amount of noise, but with a longer convergence time as a result. Relatively slow temperature variations can be successfully tracked using a low update rate, relaxing the SNR requirements on the receiver.

Figure 16:
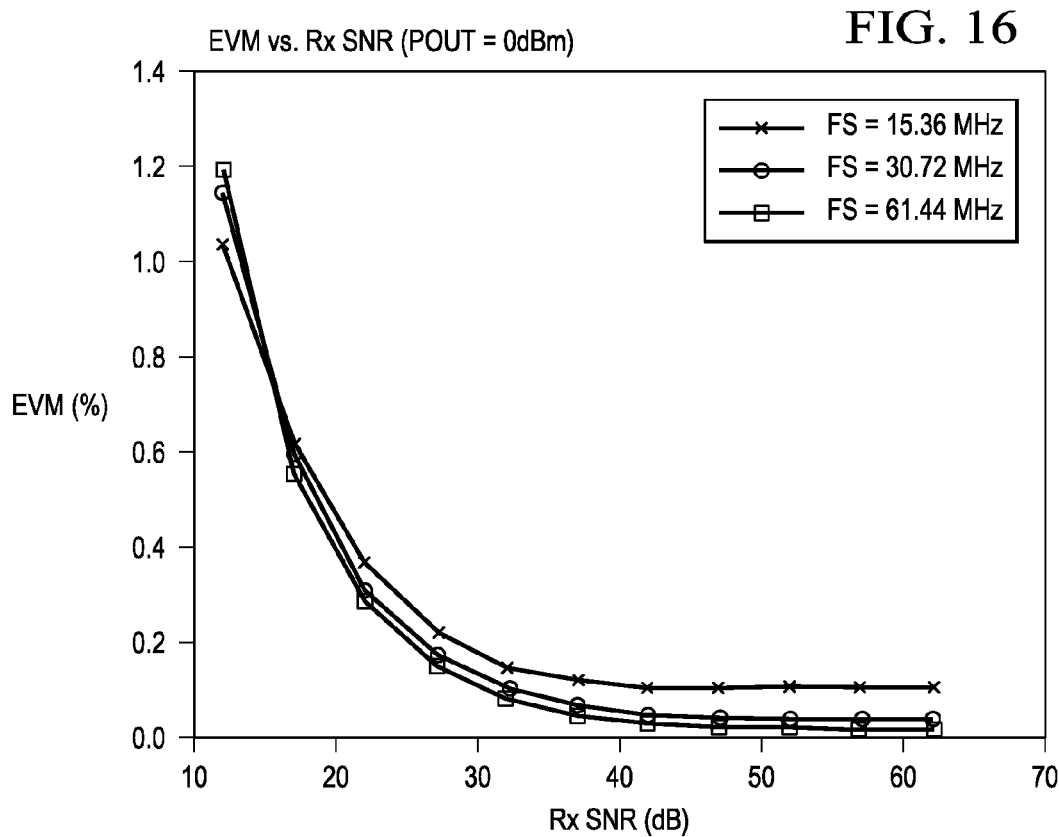
FIG. 16 is a plot showing EVM after adaptation as a function of receiver signal-to-noise ratio (SNR) in one embodiment of a polar transmitter.
Figure 17:
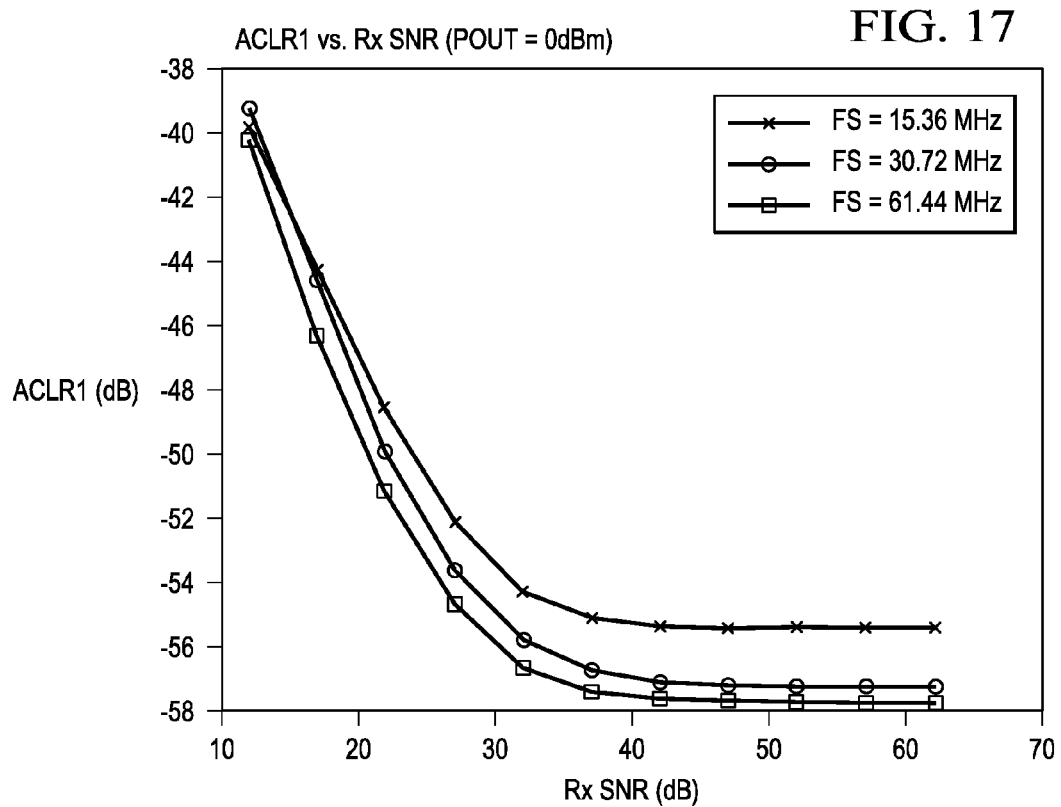
FIG. 17 is a plot showing ACLR1 after adaptation as a function of receiver SNR in one embodiment of a polar transmitter.
Figure 18:
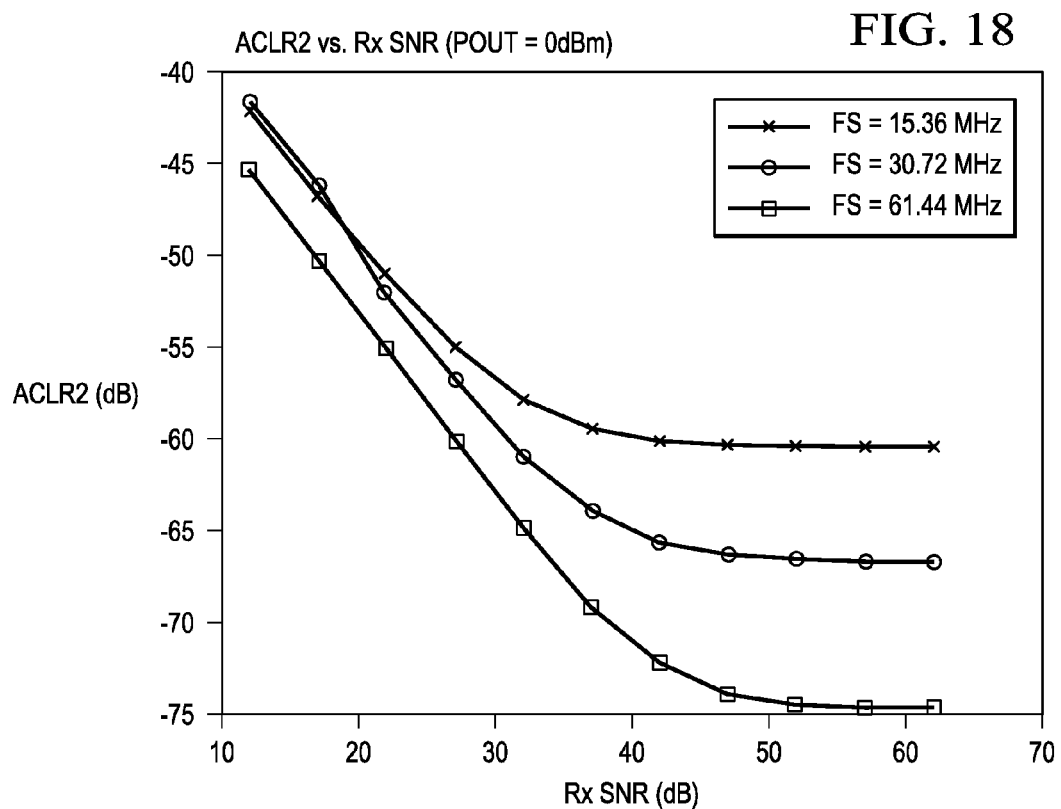
FIG. 18 is a plot showing ACLR2 after adaptation as a function of receiver SNR in one embodiment of a polar transmitter.

FIGS. 16, 17 and 18 are plots respectively showing EVM, ACLR1 and ACLR2 after adaptation as a function of receiver SNR in one embodiment of a polar transmitter. Experimental results below suggest that a receiver SNR on the order of 35 dB is required for good adaptation. An update rate between 15 MHz and 30 MHz is sufficient to track slow temperature variation. A higher sampling rate could be considered at transmitter start-up to recover quickly from an initial temperature mismatch.

Figure 19:
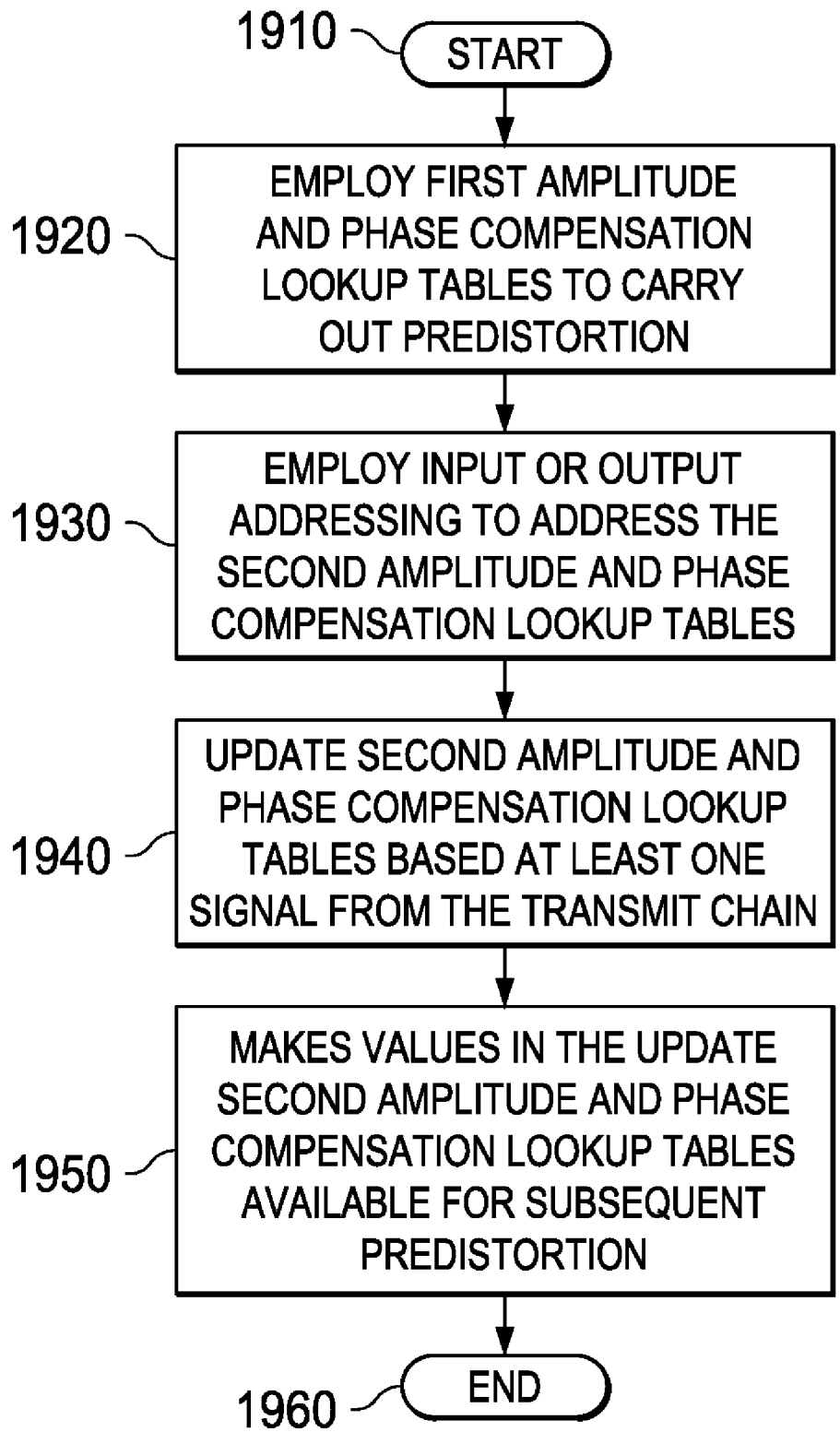
FIG. 19 is a flow diagram of one embodiment of a method of linearizing a polar transmitter carried out according to the principles of the invention.

FIG. 19 is a flow diagram of one embodiment of a linearizing a polar transmitter carried out according to the principles of the invention. The method begins in a start step 1910. In a step 1920, first amplitude and phase compensation lookup tables are employed to carry out predistortion. In a step 1930, input or output addressing may be employed to address the second amplitude and phase compensation lookup tables. In a step 1940, second amplitude and phase compensation lookup tables are updated based on at least one signal from the transmit chain. In a step 1950, values in the updated second amplitude and phase compensation lookup tables are made available for subsequent predistortion. The method ends in an end step 1960. Those skilled in the art to which the invention relates will appreciate that other and further additions, deletions, substitutions and modifications may be made to the described embodiments without departing from the scope of the invention.

What is claimed is:

1. A WCDMA polar transmitter, comprising:
   a transmit chain having a predistorter configured to employ first amplitude and phase calibration and compensation lookup tables to carry out predistortion in said transmit chain, a pre-power amplifier coupled to said predistorter and a power amplifier coupled to said pre-power amplifier;
   a receiver coupled to said transmit chain;
   predistortion compensation circuitry associated with said receiver and configured to update second amplitude and phase compensation lookup tables associated therewith based on at least one signal from at least one of said pre-power amplifier and said power amplifier, said values in said updated second amplitude and phase compensation lookup tables thereby available for subsequent predistortion;
   an adaptation engine associated with said predistortion compensation circuitry and configured to employ an iterative adaptation algorithm to reduce a difference between delayed signals provided thereto; and
   a quality monitor associated with said adaptation engine and configured to carry out a selected one of:
     regulating predistortion operational parameters,
     enabling or disabling said adaptation engine,
     controlling switching of predistortion compensation LUTs, and
     performing other sequencing operations.

2. The WCDMA transmitter as recited in claim 1 wherein said iterative adaptation algorithm is selected from the group consisting of:
   a stochastic gradient algorithm,
   a least-mean-square algorithm, and
   a recursive least squares algorithm.

3. The WCDMA transmitter as recited in claim 1 wherein said quality monitor is further configured to reduce said difference using metrics selected from the group consisting of:
   transmitted power level,
   transceiver output impedance variations, transceiver load impedance variations
transceiver voltage standing-wave ratio, and
signal-to-noise ratio.

4. The WCDMA transmitter as recited in claim 1 wherein said quality monitor is further configured to carry out a selected one of:
changing adaptation step-size,
tuning of reference and feedback signal time-alignment,
enabling or disabling predistortion adaptation, and
keeping or discarding predistortion adaptation results.

* * * * *